United States Patent
Moroz et al.

(10) Patent No.: US 11,139,402 B2
(45) Date of Patent: Oct. 5, 2021

(54) CRYSTAL ORIENTATION ENGINEERING TO ACHIEVE CONSISTENT NANOWIRE SHAPES

(71) Applicant: SYNOPSYS, INC., Mountain View, CA (US)

(72) Inventors: Victor Moroz, Saratoga, CA (US); Ignacio Martin-Bragado, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 27 days.

(21) Appl. No.: 16/409,351

(22) Filed: May 10, 2019

(65) Prior Publication Data
US 2019/0348541 A1     Nov. 14, 2019

Related U.S. Application Data

(60) Provisional application No. 62/671,139, filed on May 14, 2018.

(51) Int. Cl.
*H01L 27/12* (2006.01)
*H01L 29/786* (2006.01)
(Continued)

(52) U.S. Cl.
CPC .. *H01L 29/78696* (2013.01); *H01L 21/02532* (2013.01); *H01L 21/02603* (2013.01);
(Continued)

(58) Field of Classification Search
CPC ........ H01L 21/02532; H01L 21/02603; H01L 21/02609; H01L 21/30604; H01L 21/3247;
(Continued)

(56) References Cited

U.S. PATENT DOCUMENTS

| 3,765,969 A | 10/1973 | Kragness et al. |
| 4,882,294 A | 11/1989 | Christenson |

(Continued)

FOREIGN PATENT DOCUMENTS

| CN | 102117737 A | 7/2011 |
| CN | 107845577 A | 3/2018 |

(Continued)

OTHER PUBLICATIONS

PCT/US2019/032059—International Search Report and Wirtten Opinion dated Sep. 10, 2019, 11 pages.
(Continued)

*Primary Examiner* — Brook Kebede
(74) *Attorney, Agent, or Firm* — Haynes Beffel & Wolfeld LLP; Andrew L. Dunlap

(57) ABSTRACT

The independent claims of this patent signify a concise description of embodiments. Disclosed is technology, roughly described, in which a semiconductor structure includes a substrate supporting a column of at least one (and preferably more than one) horizontally-oriented nanosheet transistor, each having a respective channel segment of semiconductor crystalline nanosheet material (preferably silicon or a silicon alloy) sheathed by gate stack material, wherein the channel segments have a diamond cubic crystal structure and are oriented such that the {111} planes are horizontal. Also disclosed is a method for fabricating such a structure, and a corrugated substrate that may be formed as an intermediate product. This Abstract is not intended to limit the scope of the claims.

19 Claims, 10 Drawing Sheets

(51) Int. Cl.
- *H01L 29/04* (2006.01)
- *H01L 29/06* (2006.01)
- *H01L 29/34* (2006.01)
- *H01L 29/423* (2006.01)
- *H01L 29/66* (2006.01)
- *H01L 21/02* (2006.01)
- *H01L 21/306* (2006.01)
- *H01L 21/324* (2006.01)

(52) U.S. Cl.
CPC .. *H01L 21/02609* (2013.01); *H01L 21/30604* (2013.01); *H01L 21/3247* (2013.01); *H01L 29/045* (2013.01); *H01L 29/0673* (2013.01); *H01L 29/34* (2013.01); *H01L 29/42392* (2013.01); *H01L 29/66742* (2013.01)

(58) Field of Classification Search
CPC ... H01L 29/045; H01L 29/0673; H01L 29/34; H01L 29/42392; H01L 29/66742; H01L 29/78696
USPC ......................................................... 257/347
See application file for complete search history.

(56) References Cited

U.S. PATENT DOCUMENTS

| | | |
|---|---|---|
| 5,641,380 A | 6/1997 | Yamazaki et al. |
| 5,810,923 A | 9/1998 | Yano et al. |
| 6,137,136 A | 10/2000 | Yahata et al. |
| 6,376,339 B2 | 4/2002 | Linthicum et al. |
| 6,482,742 B1 | 11/2002 | Chou |
| 6,656,271 B2 | 12/2003 | Yonehara et al. |
| 6,960,781 B2 | 11/2005 | Currie et al. |
| 7,029,977 B2 | 4/2006 | Kishimoto et al. |
| 7,038,249 B2 | 5/2006 | Suligoj et al. |
| 7,123,805 B2 | 10/2006 | Sparacin et al. |
| 7,190,050 B2 | 3/2007 | King et al. |
| 7,326,969 B1 | 2/2008 | Horch |
| 7,335,908 B2 | 2/2008 | Samuelson et al. |
| 7,387,944 B2 | 6/2008 | Tong et al. |
| 7,411,274 B2 | 8/2008 | Yamanaka et al. |
| 7,459,363 B2 | 12/2008 | Subramanian |
| 7,540,970 B2 | 6/2009 | Koh et al. |
| 7,547,637 B2 | 6/2009 | Brask et al. |
| 7,776,760 B2 | 8/2010 | Taylor |
| 7,788,818 B1 | 9/2010 | Tran et al. |
| 7,799,699 B2 | 9/2010 | Nuzzo et al. |
| 7,827,519 B2 | 11/2010 | Scheffer et al. |
| 7,831,123 B2 | 11/2010 | Sparacin et al. |
| 7,851,252 B2 | 12/2010 | Nealey et al. |
| 7,932,123 B2 | 4/2011 | Rogers et al. |
| 7,977,766 B2 | 7/2011 | Booth, Jr. et al. |
| 8,026,180 B2 | 9/2011 | Greeley et al. |
| 8,030,108 B1 | 10/2011 | Lee et al. |
| 8,084,825 B2 | 12/2011 | Fuller et al. |
| 8,241,977 B2 | 8/2012 | Scheiper et al. |
| 8,455,159 B2 | 6/2013 | Ryu |
| 8,492,068 B2 | 7/2013 | Bae et al. |
| 8,545,710 B2 | 10/2013 | Kuboi et al. |
| 8,609,550 B2 | 12/2013 | Moroz et al. |
| 8,617,799 B2 | 12/2013 | Koefer et al. |
| 8,653,599 B1 | 2/2014 | Cheng et al. |
| 8,753,942 B2 | 6/2014 | Kuhn et al. |
| 8,822,248 B2 | 9/2014 | Park |
| 9,064,808 B2 | 6/2015 | Moroz et al. |
| 9,152,750 B2 | 10/2015 | Moroz et al. |
| 9,379,183 B2 | 6/2016 | Moroz et al. |
| 9,449,820 B2 | 9/2016 | Cohen et al. |
| 9,484,347 B1 | 11/2016 | Cheng et al. |
| 10,032,859 B2 | 7/2018 | Moroz et al. |
| 10,256,293 B2 | 4/2019 | Moroz et al. |
| 2003/0047129 A1 | 3/2003 | Kawahara et al. |
| 2003/0057491 A1 | 3/2003 | Mitani et al. |
| 2003/0094674 A1 | 5/2003 | Ipposhi et al. |
| 2003/0098292 A1 | 5/2003 | Kulkarni |
| 2003/0177975 A1 | 9/2003 | Ikesue et al. |
| 2005/0067630 A1 | 3/2005 | Zhao |
| 2005/0116290 A1 | 6/2005 | de Souza et al. |
| 2005/0205859 A1 | 9/2005 | Currie et al. |
| 2006/0131553 A1 | 6/2006 | Yamanaka et al. |
| 2006/0228847 A1 | 10/2006 | Liu et al. |
| 2006/0267088 A1 | 11/2006 | Sharp et al. |
| 2007/0015371 A1 | 1/2007 | Olynick et al. |
| 2007/0029643 A1 | 2/2007 | Johnson et al. |
| 2007/0032089 A1 | 2/2007 | Nuzzo et al. |
| 2007/0099404 A1 | 5/2007 | Govindaraju et al. |
| 2007/0259467 A1 | 11/2007 | Tweet et al. |
| 2008/0108171 A1 | 5/2008 | Rogers et al. |
| 2008/0121882 A1 | 5/2008 | Hwang et al. |
| 2008/0157283 A1 | 7/2008 | Moslehi |
| 2008/0163139 A1 | 7/2008 | Scheffer et al. |
| 2008/0182419 A1 | 7/2008 | Yasui et al. |
| 2008/0253728 A1 | 10/2008 | Sparacin et al. |
| 2008/0257409 A1 | 10/2008 | Li et al. |
| 2008/0267239 A1 | 10/2008 | Hall et al. |
| 2008/0305437 A1 | 12/2008 | Fuller et al. |
| 2009/0011566 A1 | 1/2009 | Okada et al. |
| 2009/0017627 A1 | 1/2009 | Greeley et al. |
| 2009/0032873 A1 | 2/2009 | Cites et al. |
| 2009/0115094 A1 | 5/2009 | Chou et al. |
| 2009/0206054 A1 | 8/2009 | Nealey et al. |
| 2009/0309160 A1 | 12/2009 | Cohen et al. |
| 2010/0048027 A1 | 2/2010 | Cheng et al. |
| 2010/0065887 A1 | 3/2010 | Goebel et al. |
| 2010/0193860 A1 | 8/2010 | Scheiper et al. |
| 2010/0197088 A1 | 8/2010 | Sakuma et al. |
| 2010/0219505 A1 | 9/2010 | D'Evelyn |
| 2011/0104875 A1 | 5/2011 | Wojtczak et al. |
| 2011/0159699 A1 | 6/2011 | Gabriel |
| 2011/0291188 A1 | 12/2011 | Cheng et al. |
| 2012/0043623 A1 | 2/2012 | Doris et al. |
| 2012/0061349 A1 | 3/2012 | Ryu |
| 2012/0103939 A1 | 5/2012 | Wu et al. |
| 2012/0202333 A1 | 8/2012 | Breitwisch et al. |
| 2013/0026607 A1 | 1/2013 | Moroz et al. |
| 2013/0037857 A1 | 2/2013 | Von Kanel et al. |
| 2013/0298977 A1 | 11/2013 | Chen et al. |
| 2014/0223394 A1 | 8/2014 | Moroz et al. |
| 2016/0111513 A1 | 4/2016 | Liu et al. |
| 2016/0225849 A1 | 8/2016 | Wong et al. |
| 2016/0254350 A1 | 9/2016 | Cheng et al. |
| 2017/0194215 A1 | 7/2017 | Ching et al. |
| 2018/0114727 A1 | 4/2018 | Rodder et al. |
| 2018/0308766 A1* | 10/2018 | Mochizuki ...... H01L 21/823878 |
| 2019/0131415 A1* | 5/2019 | Cheng ................. H01L 29/1033 |
| 2019/0221483 A1* | 7/2019 | Mulfinger ......... H01L 21/28088 |

FOREIGN PATENT DOCUMENTS

| | | |
|---|---|---|
| JP | 2007-324384 A | 12/2007 |
| KR | 2005-0118435 A | 12/2005 |
| KR | 10-0843043 B1 | 7/2008 |
| KR | 2008-0114158 A | 12/2008 |
| KR | 10-0918864 B1 | 9/2009 |
| TW | 540117 B | 7/2003 |
| TW | 200836083 A | 9/2008 |
| TW | 200952040 A | 12/2009 |
| TW | 201020685 A | 6/2010 |
| TW | 201100946 A | 1/2011 |
| WO | 0033365 A1 | 6/2000 |

OTHER PUBLICATIONS

EP 12829654.8—Response to Second Summons to Attend Oral Proceedings dated Aug. 16, 2018, as filed Nov. 27, 2018, 19 pages.
U.S. Appl. No. 15/698,552—Notice of Allowance dated Dec. 11, 2018, 17 pages.
EP 12829654.8—Notice of Allowance (Rule 71(3) dated Dec. 20, 2018, 44 pages.
TW 108116405—First Office Action dated Aug. 17, 2020, 25 pages.
CN 2012800477749—Second Office Action dated Jul. 12, 2016, 6 pages.

(56) References Cited

OTHER PUBLICATIONS

CN 2012800477749—Response to First Office Action dated Nov. 5, 2015 filed Mar. 21, 2016, 17 pages.
Yahata et al., "Smoothing of Si Trench Sidewall Surface by Chemical Dry Etching and Sacrificial Oxidation," Jpn. J. Appl. Phys. vol. 37, (1998), pp. 3954-3955.
U.S. Appl. No. 13/190,319—Final Office Action dated Jun. 19, 2013.
TW 101132748—Response to Office Action dated Jul. 9, 2015 filed Sep. 1, 2015, 29 pages.
TW 101132748—Office Action dated Jul. 9, 2015 with English translation, 4 pages.
Tezuka T et al: "Observation of Mobility Enhancement in Strained Si and SiGe Tri-Gate MOSFETS with Multi-Nanowire channels Trimmed by Hydrogen Thermal Etching", 2007 IEEE Intl. Electron Devices Meeting: Washington, DC, Dec. 10-12, 2007, pp. 887-890.
U.S. Appl. No. 14/748,091—Office Action dated Sep. 15, 2016, 15 pages.
CN 2012800477749—Response to Second Office Action dated Jul. 12, 2016 filed Sep. 20, 2016, 14 pages.
CN 2012800477749—Notice of Allowance dated Nov. 2, 2016, 2 pages.
TW 105105645—First Office Action dated Nov. 3, 2016, 6 pages.
U.S. Appl. No. 13/190,319—Advisory Action dated Nov. 29, 2013, 4 pages.
U.S. Appl. No. 14/748,091—Response to Office Action dated Nov. 17, 2015 filed Feb. 2, 2016, 5 pages.
U.S. Appl. No. 14/748,091—Response to Final Office Action dated Mar. 29, 2016 filed May 13, 2016, 14 pages.
Yu et al., "Investigation of Nanowire Line-Edge Roughness in Gate-All-Around Silicon Nanowire MOSFETs," IEEE Transactions on Electron Devices, vol. 57, No. 11, Nov. 2010, 8 pages.
Soda et al., "Reduction effect of line edge roughness on time-dependent dielectric breakdown lifetime of Cu/low-k Interconnects by using CF3I etching," J. Vac. Sci. Technol. B 27(2), Mar./Apr. 2009, pp. 649-653.
Soda et al., "Mechanism of reducing line edge roughness in ArF photoresist by using CF3I plasma," J. Vac. Sci. Technol. B 27(5), Sep./Oct. 2009, pp. 2217-2123.
Naulleau et al., "System-level line-edge roughness limits in extreme ultraviolet lithography," J. Vac. Sci. Technol. B 26(4), Jul./Aug. 2008, pp. 1289-1293.
Pargon et al., "Linewidth roughness transfer measured by critical dimension atomic force microscopy during plasma patterning of polysilicon gate transistors," J. Vac. Sci. Technol. B (26)3, May/Jun. 2008, pp. 1011-1020.
U.S. Appl. No. 141/48,091—Final Office Action dated Feb. 21, 2017, 18 pages.
PCT/US12/47431—Written Opinion dated Jan. 28, 2013, 5 pages.
PCT/US12/47431—International Preliminary Report on Patentability dated Jan. 28, 2014, 6 pages.
U.S. Appl. No. 14/748,091—Response to Advisory Action dated Jun. 22, 2016, filed Aug. 24, 2016, 6 pages.
U.S. Appl. No. 14/748,091—Response to Office Action dated Sep. 15, 2016, filed Jan. 13, 2017, 17 pages.
PCT/US12/54224—International Preliminary Report on Patentability dated Mar. 12, 2014, 8 pages.
U.S. Appl. No. 15/192,651—Preliminary Amendment filed Nov. 9, 2016, 10 pages.
CN 2012800477749—Voluntary Amendment filed Sep. 22, 2014, 18 pages.
EP 12829654.8—Response to Search Report dated Jan. 28, 2016, filed Aug. 26, 2016, 18 pages.
TW 105105645—Response to First Office Action dated Nov. 3, 2016, filed Jan. 19, 2017, 7 pages.
KR 2014-7008640—Third Office Action (Appeal Decision) dated Dec. 26, 2016, 18 pages.
U.S. Appl. No. 14/748,091—Response to Final Office Action dated Feb. 21, 2017 filed Apr. 11, 2017, 7 pages.
U.S. Appl. No. 14/748,091—Notice of Allowance dated Apr. 27, 2017, 12 pages.
TW 105105645—Notice of Allowance dated Apr. 12, 2017, 2 pages.
Fried et al., "Comparison study of FinFETs: SOI vs. Bulk," SOI Industry Consortium, Press Release Oct. 21, 2009, 19 pages, http://www.soiconsortium.org/news-events/the-soi-industry-consortium-announces-results-of-a-soi-and-bulk-finfets-comparison-study-24.php.
EP 12829654.8—First Office Action dated Jul. 4, 2017, 5 pages.
KR 2016-7009990—Request for Examination and Amendment filed Sep. 4, 2017, 55 pages.
KR 2016-7009990—First Office Action dated Nov. 13, 2017, 12 pages.
KR 2016-7009990—Response to First Office Action dated Nov. 13, 2017 filed Jan. 11, 2018, 78 pages.
EP 12829654.8—Response to First Office Action dated Jul. 4, 2017, filed Nov. 7, 2017, 10 pages.
EP 12829654.8—Summons to Attend Oral Proceedings dated Mar. 12, 2018, 9 pages.
U.S. Appl. No. 15/192,651—Notice of Allowance dated Mar. 28, 2018, 30 pages.
KR 2016-7009990—Final Rejection dated May 23, 2018 w/translation, 8 pages.
KR 2016-7009990—Response to Final Rejection filed Jun. 25, 2018 w/claims translation, 66 pages.
KR 2016-7009990—Decision for Grant of Patent dated Jul. 11, 2018, 3 pages.
U.S. Appl. No. 15/698,552—Office Action dated Jul. 27, 2018, 45 pages.
EP 12829654.8—Written Submissions to Summons to Attend Oral Proceedings filed Aug. 14, 2018, 56 pages.
Tokoro et al; "Anistropic Etching Properties of Silicon in KOH and TMAH Solutions"; International Symposium on Micromechatronic and Human Science; Apr. 1998; 6 pages.
EP 12829654.8—Second Summons to Attend Oral Proceedings dated Aug. 16, 2018, 2 pages.
Yun et al., "Fabrication of vertical optical plane using DRIE and KOH crystalline etching of (110) silicon wafer," Sensor-and Actuators A: Physical 128, No. 2 (2006): pp. 387-394.
Yun et al., "Fabrication of morphological defect-free vertical electrodes using a (110) silicon-on-patterned-insulator process for micromachined capacitive inclinometers," Journal of Micromechanics and Microengineering 19, No. 3 (2009): 035025, Feb. 23, 2009, 7 pages.
Anthony, "IBM Unveils World's First 5nm Chip," https://arstechnica.com/gadgets/2017/06/ibm-5nm-chip/, Jun. 5, 2017, 7 pages.
Brigham Young Univeristy—Department of Elecrical and COmputer Engineering, "Crystal Planes in Semiconductors," http://www.cleanroom.byu.edu/EW_orientation.phtml, accessed Mar. 7, 2014, 3 pages.
Suk et al., "High performance 5nm radius Twin Silicon Nanowire MOSFET (TSNWFET): fabrication on bulk si wafer, characteristics, and reliability." In IEEE InternationalElectron Devices Meeting, 2005. IEDM Technical Digest., pp. 717-720. IEEE, 2005.
Martin-Bragado, I. et al., "Facet formation during Solid Phase Epitaxy Regrowth: A Lattice Kinetic Monte Carlo model," Nanoscale Science and Design, Appl. Phys. Lett. 95:12,123123, 2009, 3pp.
Martin-Bragado, I. et al., "Modeling of {311} facets using a lattice kinetic Monte Carlo three-dimensional model for selective epitaxial growth of silicon," Nanoscale Science and Design, Appl. Phys. Lett. 98:15,153111, 2011, 3pp.
"Wet-Chemical Etching and Cleaning of Silicon," Technology Notes #7, VSI Technology Library, Virginia Semiconductor Inc., www.virginiasemi.com, 2003, 11pp.
Wada, H., "UV Nanoimprint Technology for sub-25nm Half-Pitch Semiconductor Device Manufacturing," Molecular Imprints 2010 Int'l Symp. Lithography Extensions, 20 slides.
U.S. Appl. No. 13/190,319—Office Action dated Jan. 17, 2013, 16 pages.
PCT/US12/47431—International Search Report dated Jan. 28, 2013, 3 pages.
PCT/US12/54224—International Search Report dated Mar. 4, 2013, 12 pages.

(56) References Cited

OTHER PUBLICATIONS

U.S. Appl. No. 13/190,319—Response to Office Action dated Jan. 17, 2013, filed Apr. 17, 2013, 8 pages.
Mistry et al. "A 45nm Logic Technology with High-k+Metal Gate Transistors, Strained Silicon, 9 Cu Interconnect Layers, 193nm Dry Patterning, and 100% Pb-free Packaging," Electron Devices Meeting, IEDM 2007, IEEE International, Dec. 10-12, 2007, 4 pages.
Moroz et al., "Options At the 45nm Node Include Engineered Substrates," Solid State Technology, Jul. 2005, 4 pages.
U.S. Appl. No. 13/190,319—Office Action dated Jul. 17, 2014, 18 pages.
U.S. Appl. No. 14/201,584—Office Action dated Sep. 30, 2014, 13 pages.
TW 101132748—First Office Action dated Oct. 21, 2014, 12 pages.
U.S. Appl. No. 14/201,584—Office Action dated Jan. 23, 2015, 8 pages.
TW 101126042—Office Action dated Jan. 29, 2015, 17 pages.
U.S. Appl. No. 13/190,319—Notice of Allowance dated Feb. 17, 2015, 20 pages.
U.S. Appl. No. 14/201,584—Notice of Allowance dated Jun. 2, 2015, 9 pages.
U.S. Appl. No. 13/350,523—Notice of Allowance dated Aug. 14, 2013, 18 pages.
U.S. Appl. No. 14/201,584—Response to Office Action dated Jan. 23, 2015, filed May 20, 2015, 9 pages.
U.S. Appl. No. 14/201,584—Response to Office Action dated Sep. 30, 2014, filed Dec. 29, 2014, 6 pages.
TW 101132748—Response to First Office Action dated Oct. 21, 2014, filed Jan. 21, 2015, 40 pages.
U.S. Appl. No. 13/190,319—Response to Final Office Action dated Jun. 19, 2013 filed Nov. 19, 2013, 10 pages.
U.S. Appl. No. 13/190,319—Response to Office Action dated Jul. 17, 2014 filed Jan. 20, 2015, 16 pages.
TW 101126042—Response to Office Action dated Jan. 29, 2015 filed Apr. 28, 2015, 22 pages.
TW 101126042—Office Action dated Jun. 29, 2015, 12 pages.
EP 12829654—Supplemental Partial European Search Report dated Jul. 6, 2015, 7 pages.
Kalburge, A., et al. "Focused ion beam assisted chemically etched mesas on GaAs (001) and the nature of subsequent molecular beam epitaxial growth." Journal of applied physics 82.2, Jul. 15, 1997, pp. 859-864.
Wang, et al. "The morphology of InPInGaAs grown by molecular beam epitaxy onto V-grooved InP substrates." Journal of crystal growth 173.3 (1997), pp. 307-314.
Juan et al., "Controlling sidewall smoothness for micromachined Si mirrors and lenses." Journal of Vacuum Science & Technology B 14.6 (1996), pp. 4080-4084.
KR 2014-7008640—Office Action dated Jul. 20, 2015, 12 pages.
TW 101126042—Response to Office Action dated Jun. 29, 2015 filed Aug. 31, 2015, 21 pages.
KR 2014-7008640—Response to Office Action dated Jul. 20, 2015 filed Sep. 21, 2015, 70 pages.
U.S. Appl. No. 14/748,091—Office Action dated Nov. 17, 2015, 20 pages.
U.S. Appl. No. 14/869,733—Office Action dated Jan. 25, 2016, 16 pages.
CN 2012800477749—First Office Action dated Nov. 5, 2015, 20 pages.
EP 12829654.8—Search Report dated Jan. 28, 2016, 17 pages.
Nilsson D et al "Fabrication of silicon molds for polymer optics", Journal of Micromechanics & Microengineering, Instititue of Physics Publishing, Bristol, GB, vol. 13, No. 4, Jul. 1, 2003, pp. S57-S61.
Schuler H et al: "In situ etching and regrowth in III-V molecular beam epitaxy for future nanotechnology", Journal of Vacuum Science & Technology B: Microelectronicsprocessing and Phenomena, American Vacuum Society, NY, NY, US, vol. 18, No. 3, May 1, 2000, pp. 1557-1561.
Shikida M et al: "The mechanism of selective corrugation removal by KOH anisotropic wet etching", Journal of Micromechanics & Microengineering, Institute of Physics Publishing, Bristol, GB, vol. 20, No. 1, Jan. 1, 2010, p. 15038.
TW 101132748—Notice of Allowance dated Jan. 25, 2016, 2 pages.
KR 2014-7008640—Second Office Action (Final Rejection) dated Jan. 25, 2016, 8 pages.
U.S. Appl. No. 14/869,733—Response to Office Action dated Jan. 25, 2016 filed Feb. 3, 2016, 5 pages.
U.S. Appl. No. 14/869,733—Notice of Allowance dated Mar. 1, 2016, 10 pages.
U.S. Appl. No. 14/748,091—Final Office Action dated Mar. 29, 2016, 9 pages.
KR 2014-7008640—Response to Second Office Action (Final Rejection) dated Jan. 25, 2016, 22 pages.
U.S. Appl. No. 14/748,091—Advisory Action dated Jun. 22, 2016, 5 pages.
TW 101126042—Notice of Allowance dated Jun. 27, 2016, 2 pages.
TW 108116405—Response to First Office Action dated Aug. 17, 2020, as filed on Nov. 17, 2020, 15 pages.
PCT/US2019/032059—International Preliminary Report on Patentability dated Nov. 26, 2020, 8 pages, 11 pages.
TW 108116405—Allowance Decision dated Mar. 18, 2021, 3 pages.

* cited by examiner

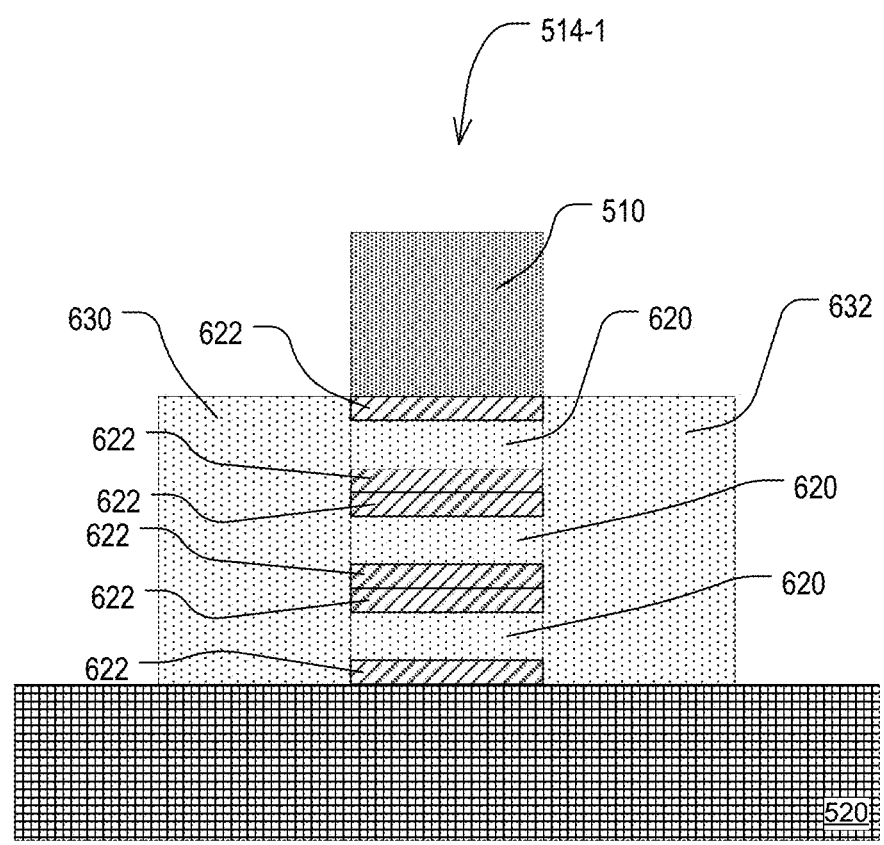
FIG. 6
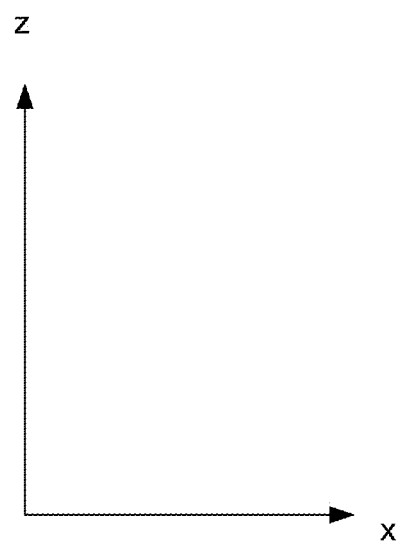

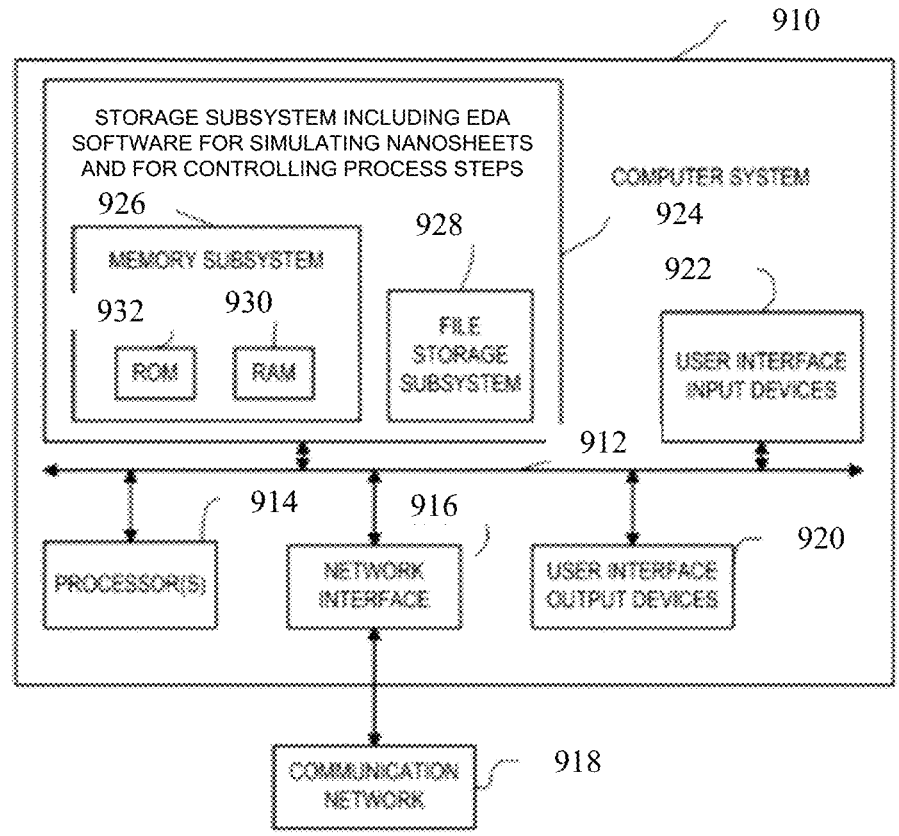
FIG. 9A
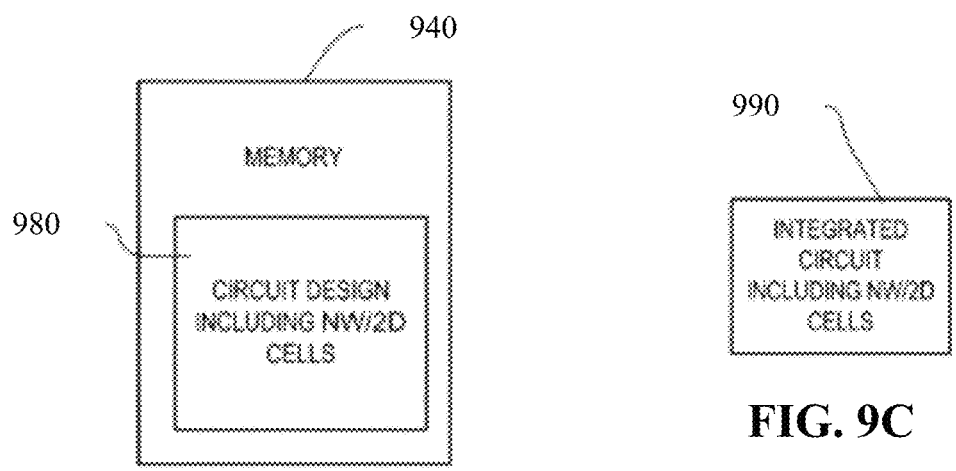
FIG. 9B
FIG. 9C

CRYSTAL ORIENTATION ENGINEERING TO ACHIEVE CONSISTENT NANOWIRE SHAPES

CROSS-REFERENCE TO RELATED APPLICATIONS

This application claims priority under 35 U.S.C. § 119(e) to U.S. Provisional Application No. 62/671,139, filed May 14, 2018, the entire contents of which are hereby incorporated by reference herein.

The following patents are also incorporated by reference herein for their teachings: U.S. Pat. Nos. 9,064,808 and 8,609,550.

FIELD OF THE INVENTION

The invention relates to nanosheet technology, and more particularly, techniques for achieving consistent nanosheet shapes.

DISCLAIMER

In the following Background, Summary, and Detailed Description, headings should not be construed as necessarily limiting. In the following Background, Summary and Detailed Description, the citation or identification of any publication does not signify relevance or status as prior art for any of the claimed or described embodiments.

BACKGROUND

Transistor technology has gone through two significant stages, and at least one more expected. For decades, MOSFET field-effect transistors have been popular in the electronics industry. With planar MOSFETs, manufactured from 1970's through 2010's. the gate (between the source and the drain) is on one side of the mostly planar transistor structure. In the 2010's, a new non-planar "FinFET" technology was introduced, where the gate is placed on three sides of a "finned" channel between the source and the drain. Planar MOSFET technology can be scaled down to about 28 nanometers, before performance degrades. FinFETs can be scaled down to about 5 nanometers. What is needed is a new transistor technology for the 3 nanometer, and below, scale, which raises additional challenges due to FinFET leakage and variability effects.

In recent years, a new generation of transistors has been developed, nanowire FETs (sometimes abbreviated as "NWTs"), that may be able to displace FinFETs in the market. With nanowire FETs, current flowing through one or more nanowires is controlled by a gate that completely surrounds the wire(s)—if the wire form was rectangular, the gate would be placed on its four sides. The paper by Victor Moroz, entitled "Technology Inflection Points: Planar to FinFET to Nanowire" (ISPD, Apr. 4, 2016), incorporated by reference herein and available at http: (slash)(slash) www (dot) ispd (dot) cc/slides/2016/3_1.pdf, reviews relationships between these three generations of FET technology.

In Courtland, The Next High-Performance Transistor Could Be Made From Lateral Nanowires, IEEE Spectrum (28 Sep. 2016), incorporated by reference herein and available at https: (slash) (slash) spectrum (dot) ieee (dot) org/ semiconductors/nanotechnology/the-next-highperformance-transistorcould-be-made-from-lateral-nanowires), the author describes an example in which the Belgium firm IMEC vertically arranges multiple 8 nanometer-wide nanowires on top of each other, each surrounded by a gate structure.

One issue in the development of NWT technology is achieving consistent cross-sectional shapes of the nanowires. FIG. 1 is a symbolic drawing of an ideal nanowire transistor shape, taken in a cross-section through the transistor at the longitudinal position of the gate stack. As can be seen, the ideal shape of the nanowire has flat top and bottom surfaces and round corners as depicted on FIG. 1. In FIG. 1, 110 is a nanowire channel, 112 is gate stack material, comprising (though not separately shown) a thin dielectric sheathing the nanowire along the gate region, and a metal all-around gate conductor sheathing the thin dielectric. The gate stack 112 is itself in contact with a conductive material 114. The dielectric is typically a high-k material, and the metal all-around gate conductor is selected in part for its work function (and as such it is sometimes referred to herein as a work function metal). The longitudinal direction of current flow is orthogonal to the page. As can be seen in FIG. 1, the nanowire shape is wider (in the transverse dimension) than it is tall (in the vertical dimension). As used herein, a "nanosheet" is a nanowire having that characteristic, and is no more than 50 nm wide. As used herein a "nanosheet transistor" is a nanowire transistor whose channel (at least) is a nanosheet as just defined.

The flat top and bottom surfaces of the channel region 110 provide a current density and threshold voltage which remain uniform across the nanosheet channel cross-section left-to-right. If the surfaces are atomically flat, it means that there is less surface scattering for the electrons and holes in the channel, and therefore higher mobility and stronger driving current. The corner rounding is helpful to avoid electric field hot spots in the surrounding high-k dielectric, because such hot spots introduce transistor degradation and leakage over time.

However, imperfections of the manufacturing process typically make nanowire shapes that have surface roughness and uneven top and bottom surfaces. Imperfections of the nanowire shape contribute to lower performance and performance variability. Circuits are typically designed to a spec that includes a guard band to accommodate manufacturing variability. Thus the higher the variability, the lower is design spec, which means that a larger number of nanowires typically are included in the circuit design than would be necessary without such variability. The larger number of nanowires translates into higher power consumption and larger chip area/cost that would otherwise be necessary.

What others have failed to provide are nanowire fabrication techniques that reduce and/or eliminate the imperfections in the shapes of nanowires produced by current fabrication techniques. More perfect shapes for such nanowires, beyond their benefits for using nanowire transistors in electronic circuits, also allows Electronic Design Automation systems to more efficiently design, model and verify electronic circuits using NWTs. It is therefore desirable to find a way to improve the fabrication of nanowire devices so as to improve the consistency in cross-sectional shape.

SUMMARY

The claims signify a brief description of one or more of the innovations, embodiments, and/or examples found within this disclosure.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

In some of the embodiments disclosed herein, improved techniques for fabricating nanowires for use in nanowire FETs are described that make use of improved nanowire orientation on wafers during fabrication to reduce and/or eliminate imperfections in the shapes of the manufactured nanowires.

Roughly described, a semiconductor structure includes a substrate supporting a column of at least one (and preferably more than one) horizontally-oriented nanosheet transistor, each having a respective channel segment of semiconductor crystalline nanosheet material (preferably silicon or a silicon alloy) sheathed by gate stack material, wherein the channel segments have a diamond cubic crystal structure and are oriented such that the {111} planes are horizontal. Preferably the gate stack material includes a gate conductor (which may be a work function metal) sheathing the channel segment of each of the nanosheet transistors and spaced from the channel segment of each of the nanosheet transistors by a gate dielectric material (which may be a high-k dielectric). Each of the nanosheet transistors can further include source and drain regions on opposite ends of the channel segments longitudinally, in which case all of the source regions can be connected in parallel, all of the drain regions can be connected in parallel, and all of the gate conductors can be connected in parallel. The structure can have more than one of such columns, with each of the nanosheet transistors including source and drain regions disposed on opposite ends of the channel segments longitudinally, and all of the source regions connected in parallel, all of the drain regions connected in parallel, and all of the gate conductors connected in parallel.

Also roughly described, a method of making a semiconductor structure includes providing a substrate, and forming one or more columns of at least one (and preferably more) horizontally-oriented nanosheet transistors supported on the substrate, each of the nanosheet transistors having a respective channel segment of semiconductor crystalline nanosheet material (preferably silicon or a silicon alloy) sheathed by gate stack material, wherein the channel segments of semiconductor crystalline nanosheet material have a diamond cubic crystal structure and are oriented such that the {111} planes are horizontal. Preferably the gate stack material includes a gate conductor (which may be a work function metal) sheathing the channel segment of each of the nanosheet transistors and spaced from the channel segment of each of the nanosheet transistors by a gate dielectric material (which may be a high-k dielectric). Each of the nanosheet transistors can further include source and drain regions on opposite ends of the of the channel segments longitudinally, in which case all of the source regions can be connected in parallel, all of the drain regions can be connected in parallel, and all of the gate conductors can be connected in parallel. The structure can have more than one of such columns, with each of the nanosheet transistors including source and drain regions disposed on opposite ends of the of the channel segments longitudinally, and all of the source regions connected in parallel, all of the drain regions connected in parallel, and all of the gate conductors connected in parallel.

Preferably the method includes forming the column of horizontally-oriented nanosheet transistors by forming a column of layers on the substrate, including at least one silicon layer each spaced from a next layer below, each of the silicon layers being oriented such that {111} planes of the silicon layers are horizontal. These columns are then annealed to round the corners of the channel segment of each of the silicon layers in the column, and then the gate stack material is applied to sheath the channel segment of each of the silicon layers. Furthermore, forming the column of horizontally-oriented nanosheet transistors can also involve forming source and drain regions on opposite ends of the channel segments longitudinally, connecting all of the source regions in parallel, connecting all of the drain regions in parallel, and connecting all of the gate conductors in parallel.

Preferably the formation of a column of layers involves forming a stack of silicon layers alternating with layers of a sacrificial material which preferably has a diamond cubic crystal structure, such as SiGe. This stack of alternating layers includes at least one silicon layer and at least one layer of the sacrificial material below each of the silicon layers and above the substrate. Then the stack is patterned to form a column of the alternating silicon layers and layers of the sacrificial material, and then the sacrificial material is removed below the channel segment of each of the silicon layers in the column, to form gaps between the silicon layers.

In order to ensure that the silicon layers are oriented such that their {111} planes are horizontal, one can start with a substrate whose top surface is silicon oriented such that its {111} planes are horizontal. The alternating layers are then formed on the top surface of the substrate by epitaxial growth.

Also roughly described, an intermediate structure includes a substrate supporting a plurality of parallel ridges, wherein each of the ridges includes a plurality of layers of silicon alternating with layers of SiGe, including at least one layer of SiGe below each of the silicon layers and above the substrate, and wherein the silicon layers are oriented such that the {111} planes are horizontal. The SiGe layers also may be oriented such that the {111} planes are horizontal. The structure may be formed by growing successive ones of the layers epitaxially over a substrate that has a {111}-oriented silicon top surface.

One or more embodiments of the invention or elements thereof can be implemented in the form of a computer product including a non-transitory computer readable storage medium with computer usable program code for controlling the performance of the method steps indicated. Furthermore, one or more embodiments of the invention or elements thereof can be implemented in the form of an apparatus including a memory and at least one processor that is coupled to the memory and operative to controlling the performance of exemplary method steps. Yet further, in another aspect, one or more embodiments of the invention or elements thereof can be implemented in the form of means for controlling one or more of the method steps described herein; the means can include (i) hardware module(s), (ii) software module(s) executing on one or more hardware processors, or (iii) a combination of hardware and software modules; any of (i)-(iii) implement the specific techniques set forth herein, and the software modules are stored in a computer readable storage medium (or multiple such media).

These and other features, aspects, and advantages of the invention will become apparent from the following detailed description of illustrative embodiments thereof, which is to be read in connection with the accompanying drawings.

BRIEF DESCRIPTION OF THE DRAWINGS

The invention will be described with respect to specific embodiments thereof, and reference will be made to the drawings.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

FIG. 6 is a side view, taken at a longitudinal-vertical plane slicing through one of the columns in FIG. 5.

FIGS. 9A, 9B and 9C depict simplified block diagrams of a computer system suitable for use with embodiments of the technology, as well as circuit design and circuit embodiments of the technology.

Figure 1:
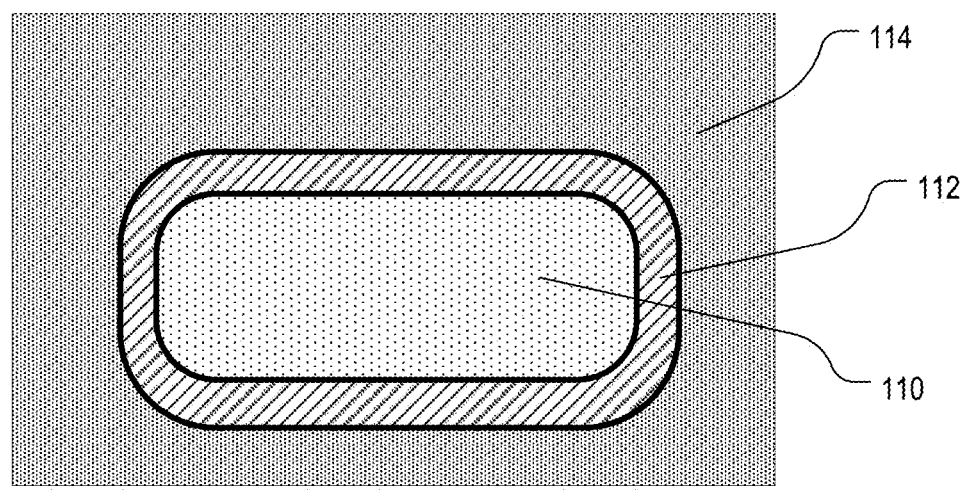
FIG. 1 is a symbolic drawing of an ideal nanosheet transistor shape, taken in a cross-section through the transistor at the longitudinal position of the gate stack.

In such various figures, reference signs may be omitted as is consistent with accepted engineering practice; however, one of ordinary skill in the art will understand that the illustrated components are readily understood when viewed in context of the illustration as a whole and the accompanying disclosure describing such various figures.

DETAILED DESCRIPTION

The following Detailed Description, Figures and Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale, and are part of the Disclosure.

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

The term "nanowire" itself, as used herein, does not imply any particular doping profile. Thus, as used herein, a "nanowire" can contain a longitudinal segment or segments having a conductivity, and if appropriate for the particular material of the nanowire a dopant concentration, suitable for operation as a channel of a transistor, a source of a transistor, a drain of a transistor or as an interconnect. A "nanowire transistor", as used herein, refers to a nanowire having a nanowire channel whose conductivity is controlled by a gate stack surrounding it in the cross-sectional plane, bounded longitudinally by source/drain regions. A nanowire transistor is sometimes referred to as a "gate all-around field effect transistor" (GAAFET). Horizontally oriented nanowires can be stacked vertically in different layers, with gate stack material surrounding each of the horizontally oriented nanowires, including in between nanowire layers. Such nanowire layers, individually surrounded by gate stack material, are considered herein to constitute separate nanowire channels. The vertically-adjacent source/drain materials in such stacked structures are typically (but not necessarily) connected together electrically, or formed as a shared source/drain material for all layers of the column. Whether or not vertically-adjacent source/drain regions are connected together, the transistors formed in each layer are considered herein to constitute separate nanowire transistors as the term is used herein. This paragraph applies equally to nanosheets and nanosheet transistors.

Figure 2:
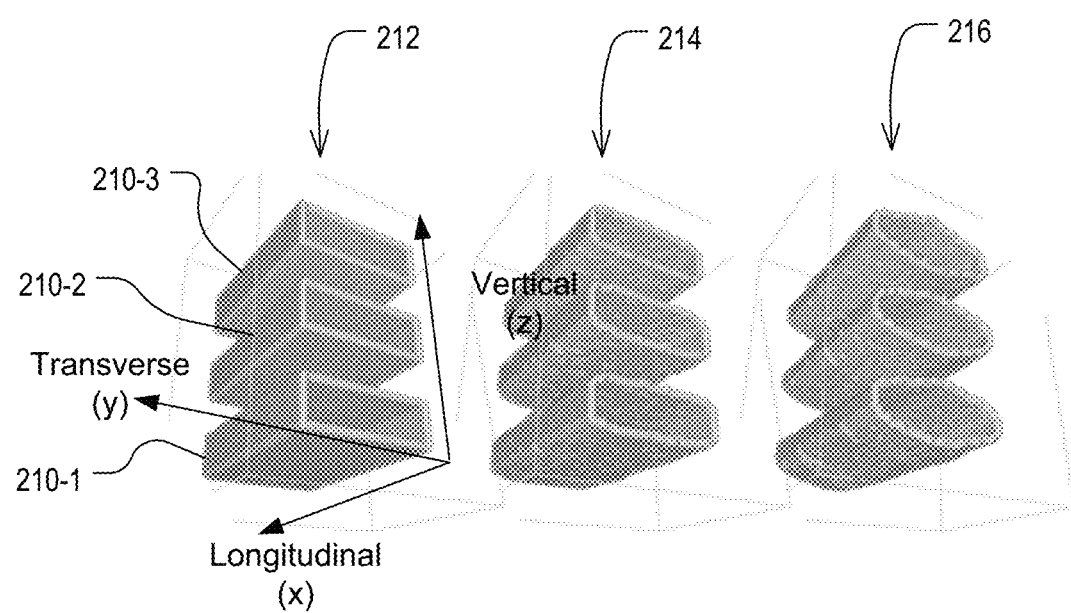
FIG. 2 is a perspective view of a vertical column of horizontally oriented nanosheets at three different stages of annealing for corner rounding.

During conventional fabrication of vertically stacked horizontally oriented nanowires, after initial formation of the nanowires, they are typically annealed in hydrogen gas in order to round the corners. However, such annealing also tends to introduce the shape distortions described above. FIG. 2 is a perspective view of a vertical column of three horizontally oriented nanosheets 210-1, 210-2 and 210-3 (representatively 210). Only the silicon nanosheets are shown; any surrounding material and any material in-between the silicon layers (such as dielectric or gate stack materials) are omitted for clarity of illustration. Thus FIG. 2 is illustrative of both nanosheet columns and nanosheet transistor columns. Three versions of the column are shown at different times during the annealing process: version 212 illustrates the column after patterning and before any annealing; version 214 illustrates the column after the initial stages of annealing, and version 216 illustrates the column after additional annealing. These images are created by simulation using the Lattice Kinetic Monte Carlo (LKMC) model in the Sentaurus Process fabrication process simulator available from Synopsys, Inc. It can be seen that flatness of the top and bottom surfaces degrades as annealing proceeds.

FIG. 2 also illustrates some directional conventions that are used in the present specification. In particular, As used herein, the "longitudinal" (X) direction of a nanowire or nanowire transistor is the direction parallel to current flow, and the "transverse" (Y) direction of a transistor is the direction cross-wise to the current flow but parallel to the substrate (not shown). The longitudinal and transverse directions are both considered herein to be "horizontal" directions, and are parallel to a major surface of the substrate. Thus "horizontal" is defined relative to the major surface of the substrate. The "vertical" direction is considered herein to be orthogonal to the horizontal directions.

Figure 3:
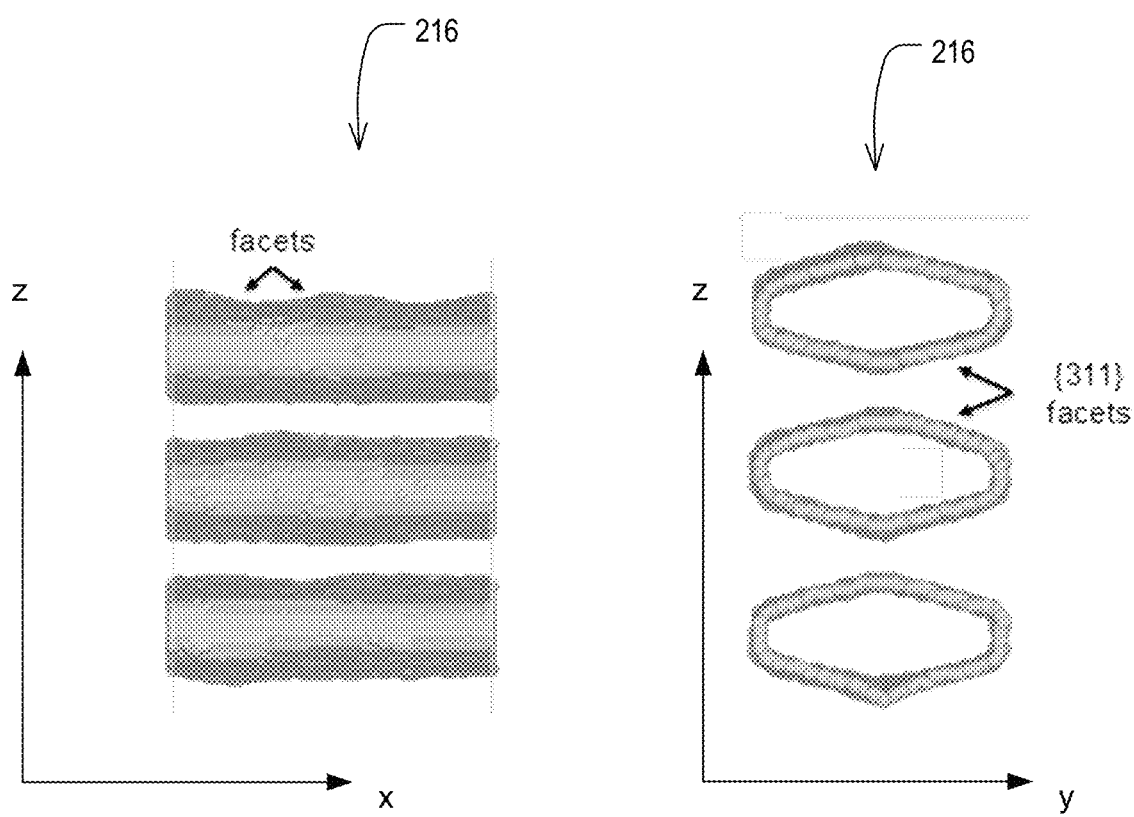
FIG. 3 illustrates a side view and an end view of the nanosheet column of FIG. 2 after annealing.

Simulations further reveal the cause of the flatness degradation. FIG. 3 illustrates a side view (on the left) and an end view (on the right) of the nanosheet column 216. It can be seen that as annealing proceeds, (311) facets of the silicon nanosheet become more pronounced.

Miller indices are a notation system for specifying directions of planar surfaces in crystal lattices. All lattice planes and lattice directions herein are described by their Miller Indices. In a diamond cubic lattice system, such as that of silicon and SiGe, the direction [hkl] defines a vector direction normal to surface of a particular plane or facet. The Miller indices for a particular facet of the lattice can be identified by first determining the points at which the facet intersects the three axes, for example at (a,0,0), (0,b,0), (0,0,c). If the facet is parallel to an axis, it is said to intersect the axis at infinity. The Miller index for the facet is then specified by (1/a,1/b,1/c), where the three numbers are expressed as the smallest integers (common factors are removed). Negative quantities are indicated with an overbar.

As a crystal is periodic, there exist families of equivalent directions and planes. As used herein, notation is used to distinguish between a specific direction or plane and families of directions or planes. In particular, square brackets are used to identify a specific direction (e.g. [1,0,−1]); angle brackets are used to identify a family of equivalent directions (e.g. <110>). Parentheses are used to identify a specific plane (ie (113)), and braces are used to identify a family of equivalent planes (e.g. {311}). A bar above an index is equivalent to a minus sign in front of the index.

As used herein, a wafer or substrate orientation is defined by its normal direction, and currently {100} wafers family of planes is standard in semiconductor fabrication. Because of crystallographic symmetry, all the specific directions in the {100} family have the same epitaxial growth and etching properties. Whereas a family of wafer orientation directions is denoted herein with curly brackets, if a specific direction is referenced herein, it is enclosed in parentheses, such as (100). Most modern lithographic processes orient all transistors such that their longitudinal direction is the <110>family of crystallographic directions. A family of lithographic orientation directions is denoted with angle brackets, whereas if a specific direction is referenced herein, it is enclosed in square brackets, such as [110].

Wet chemical etching solutions that favor anisotropically etching in a specified direction are particularly useful in manufacturing nanosheet transistors. The standard practice in industry is to use {100} wafers (i.e. wafer surface is {100} oriented, such that its normal points vertically), with transistors oriented along the {110} direction. The simulations in FIGS. 2 and 3 assume the silicon nanosheets have the standard {100} orientation. This gives rise to the (311) facets.

In some of the embodiments disclosed herein, the stability of {111} plane in a diamond-cubic crystal lattice is taken advantage of to reduce manufactured nanosheet imperfections. In particular, for the embodiments disclosed herein, the nanosheets are oriented in the {111} direction rather than in the standard {100} direction. Furthermore, preferably, nanosheet transistors are oriented with their longitudinal direction oriented along the {110} direction. Still further, a fabrication method is described herein which uses epitaxial growth to form the nanosheet layers. Since the crystal orientation of an epitaxial layer follows the crystal orientation of the layer on which it is grown, in some embodiments herein the nanosheets are formed using {111} wafers instead of using standard {100} wafer. As a result, the top and bottom surfaces of the nanosheets become {111} surfaces.

Figure 4:
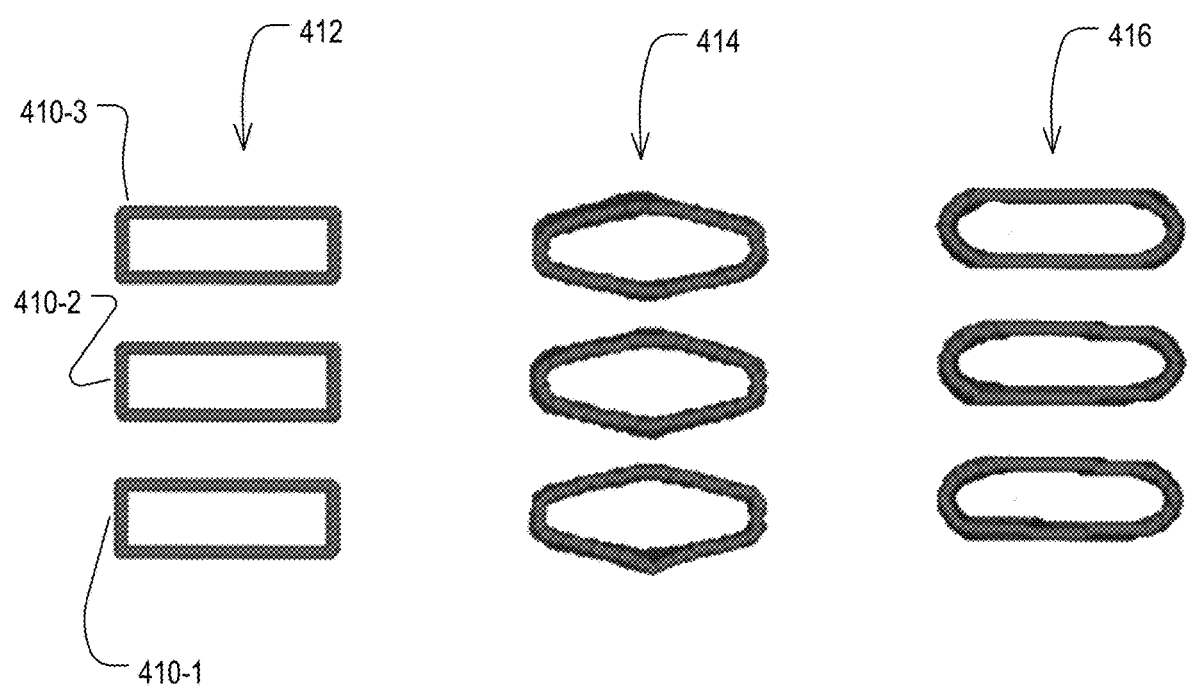
FIG. 4 illustrates nanosheet shapes after corner rounding anneal for the standard {100} versus {111} substrates.

During the manufacturing process, with the etching away of SiGe layers between Si nanosheets, followed by corner rounding of the nanosheets and then by hydrogen annealing in a high temperature hydrogen gas environment, the {111} surfaces are more stable in the anneal than any other surfaces of the crystal lattice and therefore develop less surface roughness and fewer deviations from a flat surface than any other surfaces of the crystal lattice. FIG. 4 illustrates nanosheet shapes after corner rounding anneal for the standard {100} versus {111} substrates used in the embodiments disclosed herein. In FIG. 4, an initial column 412 of three silicon nanosheets 410-1, 410-2 and 410-3 (illustratively 410) is shown. Column 414 illustrates the cross-sectional shape of the nanosheets after corner rounding if the nanosheets 410 where oriented with standard {100} top and bottom surfaces. Column 416 illustrates the cross-sectional shape of the nanosheets after corner rounding if the nanosheets 410 were oriented with {111} top and bottom surfaces. it can be seen that the {111} nanosheets retain their flatness on their top and bottom surfaces much better than the standard {100} nanosheets do. Again, these images are created by simulation using the Sentaurus Process LKMC model mentioned above.

A surface with less atomistic surface roughness provides less scattering for the electrons and holes, which translates into higher transistor performance and less performance variation from transistor to transistor. Additionally, more consistent nanosheet thickness across the channel gives more uniform current density distribution within the nanosheet and avoids current crowding.

The reduced performance variability means that there is less guard-banding (the practice of adjusting specification limits to account for uncertainty in the transistor performance) to subtract from the target design specification and therefore fewer transistors can be used to produce the same drive strength and switching speed, which reduces power consumption and chip area/cost. Besides, additional corner rounding can be obtained while preserving the flat top and bottom nanosheet surfaces, and that additional corner rounding reduces electric field hot spots in the high-k dielectric and therefore suppresses transistor degradation over time.

Figure 5:
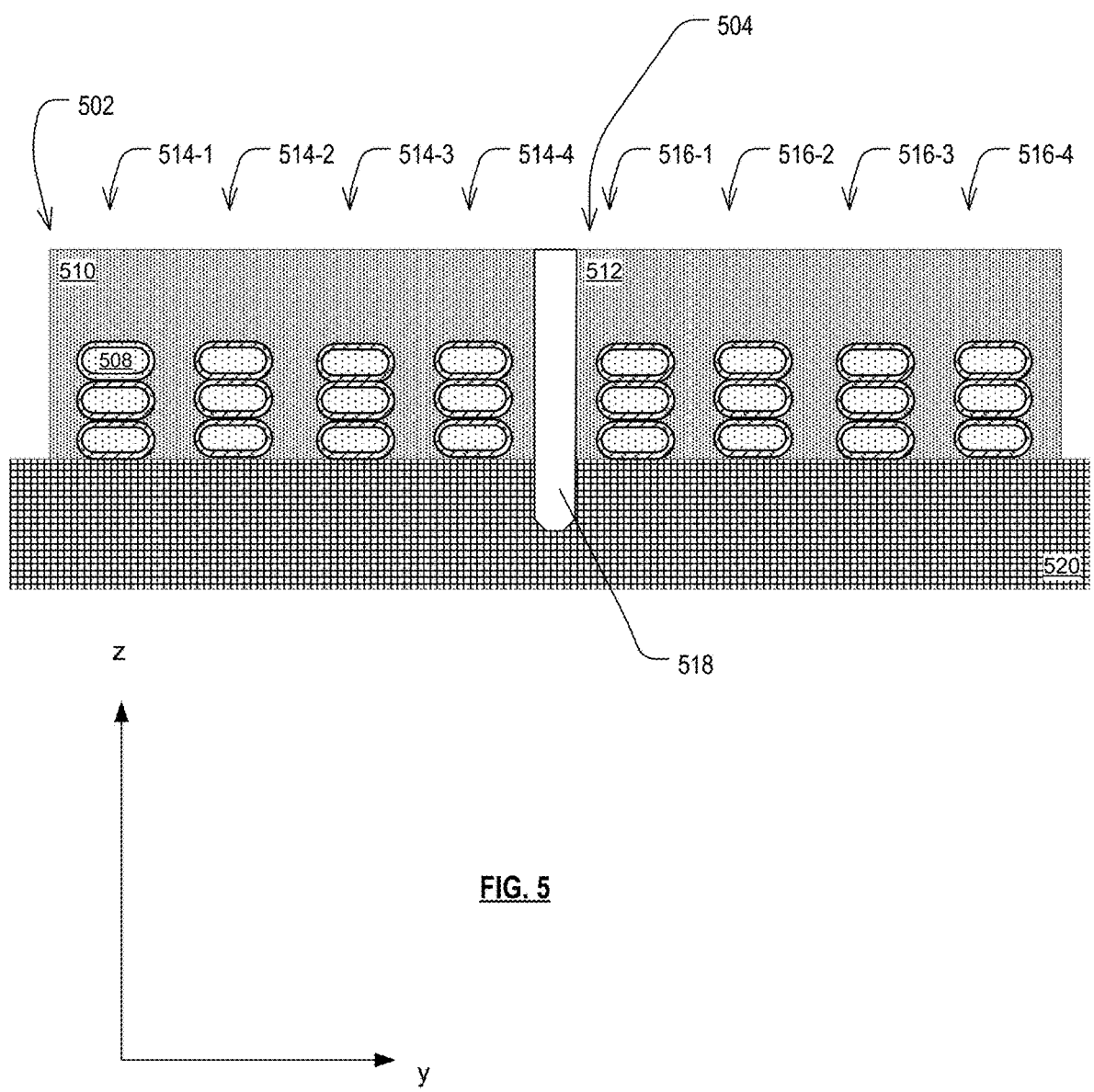
FIG. 5 is an end-on view of two transistors, each with 12 nanosheet transistors in parallel, incorporating features of the invention.

FIG. 5 is an end-on view of two nanosheet transistors 502 and 504, which incorporate features of the invention. The illustration is taken in cross-sectional view at the longitudinal position of the channel regions. Transistor 502 includes four columns 514-1, 514-2, 514-3 and 514-4 (illustratively 514) of three nanosheet transistors 508 each. Similarly, transistor 504 includes four columns 516-1, 516-2, 516-3 and 516-4 (illustratively 516) of three nanosheet transistors 508 each. Each nanosheet transistor 508 is constructed as shown and described with respect to FIG. 1, except that the channel regions are constructed of {111}-oriented silicon. The gate conductors of all of the nanosheet transistors 508 in transistor 502 are connected together by the conductive material 510, and the gate conductors of all of the nanosheet transistors 508 in transistor 504 are connected together by the conductive material conductor 512, which may be the same material as 510 (such as tungsten, for example). All of the columns are supported on a substrate 520, which may for example be silicon, or any other structure which can provide mechanical support for the columns. The mechanical support can be rigid or flexible in various embodiments. The two conductors 510 and 512 are separated electrically by a dielectric region 518, which also extends partially into the substrate.

Each of the nanosheets also includes source and drain regions on longitudinally opposite sides of the channel segment. All of the source regions in a column, and indeed in all the columns of transistor 502, are connected together electrically. Similarly, all of the drain regions in a column, and indeed in all the columns of transistor 502, are connected together electrically. The same is true for transistor 504. As such, since the gate conductors of each transistor are connected together as well, each transistor 502, 504 effectively contains 12 nanosheet transistors connected in parallel. Transistors such as 502 and 504 thus offer the drive strength of 12 nanosheet transistors each, but because of their gate-all-around structure, they also tightly control current flow when in the off-state.

FIG. 6 is a side view, taken at a longitudinal-vertical plane slicing through one of the columns 514-1 (FIG. 5). The {111}-oriented silicon channels 620 for each of the three transistors of the column can be seen, as well as the gate stack material 622 above and below each of the channels 620. The conductive material 510 is also shown in FIG. 6, as is the substrate 520. In general, a nanosheet transistor incorporating aspects of the invention can have any number of columns connected in parallel; some such transistors have only one column, whereas others can have as many as 12 or more columns. Similarly, each column can have any number of nanosheet transistors, including only a single one. Furthermore, different columns can have different numbers of nanosheet transistors. The source region 630 and the drain region 632 are shown on opposite ends of the channel segments 620 longitudinally.

Figure 7:
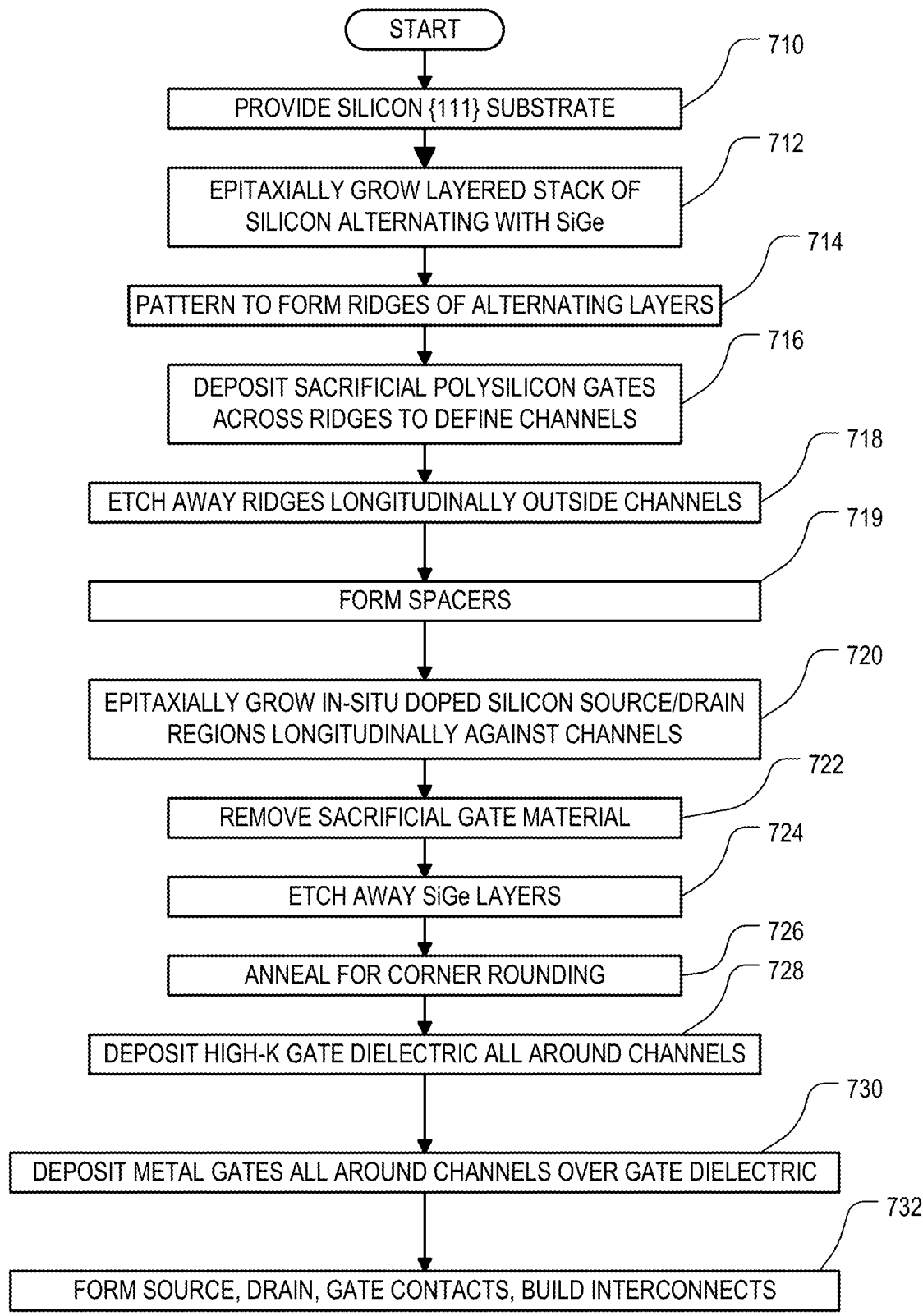
FIG. 7 is a flow chart illustrating one way to fabricate a structure according to aspects of the invention.

FIG. 7 is a flow chart illustrating one of many possible ways for fabricating a structure according to aspects of the invention. The steps of FIG. 7 can be controlled using processors programmed using computer programs stored in memory accessible to the computer systems and executable by the processors, by dedicated logic hardware, including field programmable integrated circuits, or by combinations of dedicated logic hardware and computer programs. Each block in the flowchart describes a step or steps that can be controlled in hardware or in software running on one or more computing processes executing on one or more computer systems. In one embodiment, each step of the flow chart illustrates the function controlled by a separate module of software. In another embodiment, the step is controlled by software code routines which are distributed throughout more than one module. As with all flowcharts herein, it will be appreciated that many of the steps can be combined, performed in parallel or performed in a different sequence without affecting the structures fabricated, or by affecting the resulting structures in ways that nevertheless still obtain some or all of the benefits of the invention. In some cases, as the reader will appreciate, a re-arrangement of steps will achieve such results only if certain other changes are made as well. In other cases, as the reader will appreciate, a re-arrangement of steps will achieve the such results only if certain conditions are satisfied. Furthermore, it will be appreciated that the flow charts herein show only steps that are pertinent to an understanding of the invention, and it will be understood that in a specific embodiment, numerous additional steps for accomplishing other functions for that embodiment can be performed before, after and between those steps shown.

The method of FIG. 7 takes advantage of the properties of epitaxial growth, in which each layer of crystalline material that is grown on an underlying layer will have the same crystal orientation of the underlying layer. Accordingly, the method of FIG. 7 begins in step 710 with providing a silicon {111} substrate. In one embodiment the substrate has a buried oxide layer, whereas in another embodiment it does not. Regardless, though, the top surface of the substrate has a {111} crystal orientation.

In step 712, alternating layers of SiGe and silicon are grown epitaxially on the top surface of the substrate. An SiGe layer is grown first. This leaves a layered stack of silicon layers alternating with SiGe layers, with the bottom layer being SiGe. Alternatively, another sacrificial material that has a diamond cubic crystal structure like silicon, can be used instead of SiGe. In one aspect of the invention, a substrate having been processed to this point can be packaged and sold as an intermediate product for further processing by others.

In step 714, the substrate is patterned to form ridges of the alternating layers. Each of the ridges is wider in the transverse dimension than the height of each of the silicon layers in the vertical dimension. At least a subset of such ridges are parallel to each other, as described in King U.S. Pat. No. 7,190,050, incorporated by reference for all its teachings, drawings, and the variations it describes. As pointed out in the King patent, and in one aspect of the present invention, a wafer or substrate having been processed to this point can be packaged and sold as an intermediate product for further processing by others. Such a wafer is sometimes referred to as a "corrugated" wafer.

In step 716, sacrificial gate material, such as polysilicon, is deposited across the ridges to define channel segments of the nanosheet transistors. The ridges are then etched away longitudinally outside the channel segments (step 718). In step 719 the spacers are formed to electrically separate the gate from the source and drain, and in step 720 the source and drain regions are grown back epitaxially as in-situ doped source/grain regions on the longitudinally opposite sides of the channels.

In step 722 the sacrificial gate material is removed, exposing the channel segments. In step 724 the sacrificial layers of the column are etched away preferentially relative to the silicon channel segments. This leaves gaps below each of the silicon channel segments, which are themselves supported on both ends longitudinally by the source and drain regions. In step 726 the structure is subjected to an anneal, for example in hydrogen gas, to round the corners of the silicon channel segments. As previously discussed, because the channel segments are oriented such that their top and bottom surfaces are parallel to the {111} crystal planes, this anneal can round the corners without significantly reducing the flatness of the top and bottom surfaces.

In step 728, the high-K gate dielectric material is deposited all around the channels, including on the surfaces of the silicon layers that bound the gaps; however, gaps still remain between the high-K dielectric material of different silicon layers. For example, Atomic Layer Deposition (ALD) can be used for this step. And in step 730, the work function metal gate material is deposited all around the channels over the dielectric material, including in the remaining gaps. Again, ALD may be used for this step.

In step 732, middle-of-line and back-end-of-line processing can occur, such as forming source, drain and gate contacts and building interconnects.

EDA System/Workflow Explanation

Figure 8:
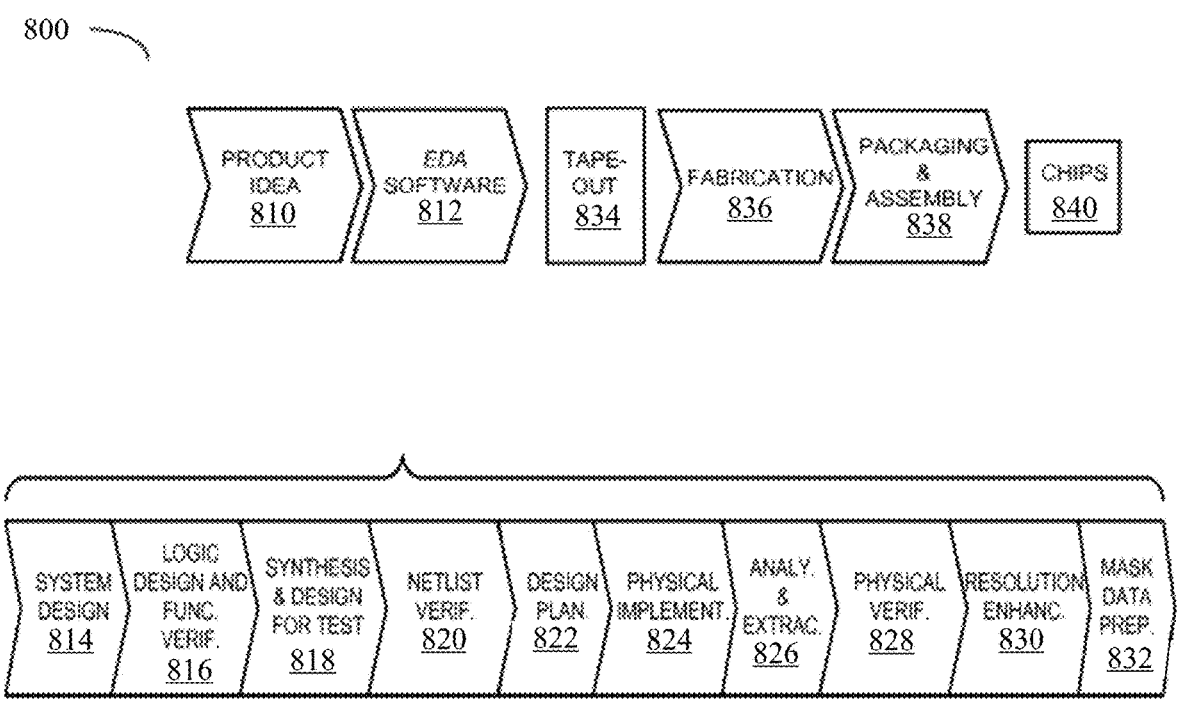
FIG. 8 depicts a flowchart of various operations in the design and fabrication of an integrated circuit in accordance with an embodiment of the present disclosure.

FIG. 8 illustrates various processes performed in the design, verification and fabrication of an item of manufacture such as an integrated circuit using software tools with a computer, and possibly special hardware-assisted tools, to transform and verify design data and instructions that represent the integrated circuit. These processes start with the generation of a product idea 810 with information supplied by a designer, information which is transformed during a process to create an item of manufacture (referred to herein as a design or device) that uses an EDA software tool 812, which may also be signified herein as EDA software, as a design tool, or a verification tool. When the design is finalized, it can be taped-out 834, which typically is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed, which result in the finished integrated circuit 840 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language (HDL) such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level (RTL) description, a gate-level (GL) description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, much used detailed descriptions of analog-based circuits.

A design process that uses an EDA software tool 812 includes processes 814-832, which are described below. This design flow description is for illustration purposes only and is not meant to limit the present disclosure. For example, an actual integrated circuit design may require a designer to perform the design operations in a different sequence than the sequence described herein.

During system design 814, a designer describes the functionality to be manufactured. The designer can also perform what-if planning to refine the functionality and to check costs, etc. Hardware-software architecture partitioning can occur at this stage. Exemplary EDA software products from Synopsys, Inc. of Mountain View, Calif., that can be used at this stage include: Model Architect, Saber, System Studio, and Designware products.

During logic design and functional verification 816, modules in the circuit are specified in one or more hardware description languages, or HDLs, and the design in HDL is checked for functional accuracy, that is, to match the requirements of the specification of the circuit or system being designed to ensure that the design produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as 'emulators' or 'prototyping systems' are used to speed up the functional verification. Exemplary EDA software products from Synopsys, Inc. of Mountain View, Calif. that can be used at this stage include: VCS, Vera, Designware, Magellan, Formality, ESP and Leda products. Exemplary emulator and prototyping products also available from Synopsys that can be used at this state include: Zebu.RTM. and Protolink.RTM. (RTM="Registered Trademark").

During synthesis and design for test 818, HDL code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

During netlist verification 820, the netlist is checked for compliance with timing constraints and for correspondence with the HDL code. Exemplary EDA software products from Synopsys, Inc. of Mountain View, Calif. that can be used at this stage include: Formality, Primetime, and VCS products.

During design planning 822, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation 824, the physical placement (positioning of circuit elements such as transistors or capacitors) and routing (connection of the same by a plurality of conductors) occurs, as can selection of library cells to perform specific logic functions. Exemplary EDA software products from Synopsys, Inc. of Mountain View, Calif. that can be used at this stage include: the Astro and IC Compiler products.

During analysis and extraction 826, the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification 828, the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement 830, geometric manipulations of the layout are performed to improve manufacturability of the design. Exemplary EDA software products from Synopsys, Inc. of Mountain View, Calif. that can be used at this stage include: Proteus products.

During tape-out, data is created to be used (after lithographic enhancements are applied if appropriate) for production of lithography masks. Example EDA software products from Synopsys, Inc., that can be used during tape-out include the IC Compiler and Custom Designer families of products.

During mask-data preparation 832, the 'tape-out' data is used to produce lithography masks that are used to produce finished integrated circuits. Exemplary EDA software products from Synopsys, Inc. of Mountain View, Calif. that can be used at this stage include the CATS family of products.

For all of the above mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 812.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

General Computer Explanation

FIGS. 9A, 9B and 9C are simplified block diagrams of a computer system suitable for use with embodiments of the technology, as well as circuit design and circuit embodiments of the technology.

In FIG. 9A, computer system 910 typically includes at least one computer or processor 914 which communicates with a number of peripheral devices via bus subsystem 912. Typically, the computer can include, or the processor can be, any of a microprocessor, graphics processing unit, or digital signal processor, and their electronic processing equivalents, such as an Application Specific Integrated Circuit (ASIC) or Field Programmable Gate Array (FPGA). The terms 'processor' and 'computer' are further defined below. These peripheral devices may include a storage subsystem 924, comprising a memory subsystem 926 and a file storage subsystem 928, user interface input devices 922, user interface output devices 920, and a network interface subsystem 916. The input and output devices allow user interaction with computer system 910.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted "blade", a kiosk, a television, a game station, a network router, switch or bridge, or any data processing machine capable of executing instructions 124 (sequential or otherwise) that specify actions to be taken by that machine.

The computer system typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions 124 to perform any one or more of the sets of instructions discussed herein. Due to the ever-changing nature of computers and networks, the description of computer system 910 depicted in FIG. 9A is intended only as one example for purposes of illustrating the preferred embodiments. Many other configurations of computer system 910 are possible having more or less components than the computer system depicted in FIG. 9A.

Network interface subsystem 916 provides an interface to outside networks, including an interface to communication network 918, and is coupled via communication network 918 to corresponding interface devices in other computer systems or machines. Communication network 918 may comprise many interconnected computer systems, machines and communication links. These communication links may be wireline links, optical links, wireless links, or any other devices for communication of information. Communication network 918 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 922 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term "input device" is intended to include all possible types of devices and ways to input information into computer system 910 or onto communication network 918. User interface input devices typically allow a user to select objects, icons, text and the like that appear on some types of user interface output devices, for example, a display subsystem.

User interface output devices 920 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from computer system 910 to the user or to another machine or computer system.

Memory subsystem 926 typically includes a number of memories including a main random-access memory (RAM) 930 (or other volatile storage device) for storage of instructions and data during program execution and a read only memory (ROM) 932 in which fixed instructions are stored. File storage subsystem 928 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 928.

Bus subsystem 912 provides a device for letting the various components and subsystems of computer system 910 communicate with each other as intended. Although bus subsystem 912 is shown schematically as a single bus, alternative embodiments of the bus subsystem may use multiple busses. For example, RAM-based main memory can communicate directly with file storage systems using Direct Memory Access (DMA) systems.

FIG. 9B depicts a memory 940 such as a non-transitory, computer readable data and information storage medium associated with file storage subsystem 928, and/or with network interface subsystem 916, and can include a data structure specifying a circuit design. The memory 940 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 9C signifies an integrated circuit 990 created with the described technology that includes one or more cells selected, for example, from a cell library.

Emulation Environment Explanation

Figure 10:
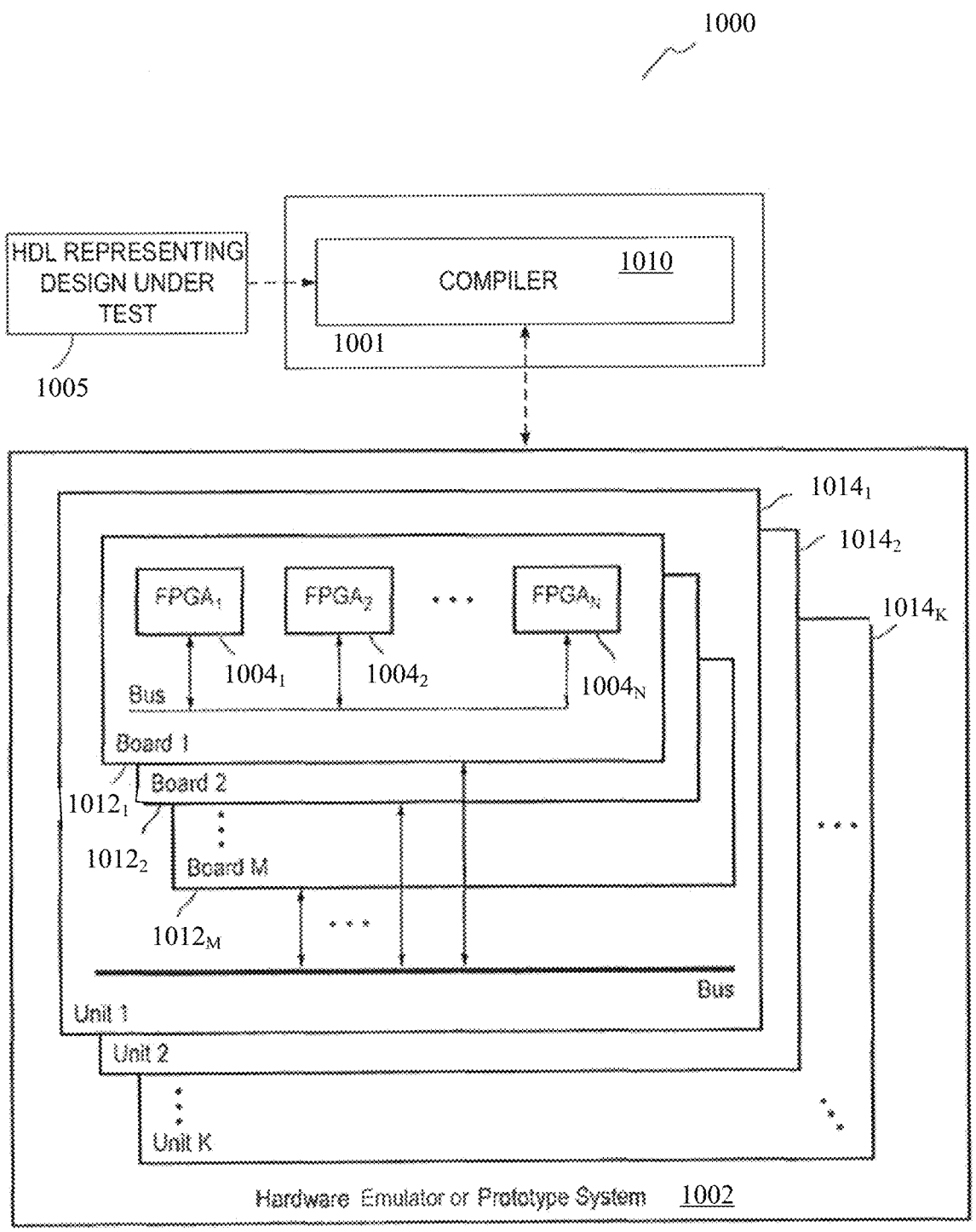
FIG. 10 depicts a block diagram of an emulation system.

An EDA software system, such as element 812 depicted in FIG. 8 typically includes an emulation system 816 to verify the functionality of the circuit design. FIG. 10 depicts a typical emulation system which includes a host computer system 1001 (often part of an EDA system) and an emulator system 1002 (typically a set of programmable devices such as Field Programmable Gate Arrays (FPGAs)). The host system generates data and information, typically using a compiler 1010, to configure the emulator to emulate a circuit design. One of more circuit designs to be emulated are referred to as a DUT (Design Under Test). The emulator is a hardware system that emulates a DUT, for example, to use the emulation results for verifying the functionality of the DUT. One example of an emulation system that can be used for the embodiments disclosed herein is the ZeBus Server available from Synopsys, Inc.

The host system 1001 comprises one or more processors. In the embodiment where the host system is comprised of multiple processors, the functions described herein as being performed by the host system may be distributed among the multiple processors.

The host system 1001 typically includes a compiler 1010 that processes code written in a hardware description language that represents a DUT, producing data (typically binary) and information that is used to configure the emulation system 1002 to emulate the DUT. The compiler 1010 may transform, change, reconfigure, add new functions to, and/or control the timing of the DUT.

The host system and emulator exchange data and information using signals carried by an emulation connection. The connection can be one or more electrical cables, for example, cables with pin configurations compatible with the RS232 or USB protocols. The connection can be a wired communication medium or network, such as a local area network, or a wide area network such as the Internet. The connection can be a wireless communication medium or a network with one or more points of access, using a wireless protocol such as Bluetooth.RTM. or IEEE 802.11. The host system and emulator can exchange data and information through a third device, such as a network server.

The emulator includes multiple FPGAs (or other programmable devices), for example, elements $1004_1$ to $1004_N$ in FIG. 10. Each FPGA can include one or more FPGA interfaces through which the FPGA is connected to other FPGAs of the emulator (and potentially other emulator hardware components), in order for the FPGAs to exchange signals. An FPGA interface may also be referred to as an input/output pin or an FPGA pad. While some embodiments disclosed herein make use of emulators comprising FPGAs, other embodiments can include other types of logic blocks instead of, or along with, the FPGAs for emulating DUTs, for example, custom FPGAs, specialized ASICs for emulation or prototyping, memories, and input/output devices.

A programmable device may include an array of programmable logic blocks and a hierarchy of reconfigurable interconnects that allow the programmable logic blocks to be connected to each other according to the descriptions in the HDL code. Each of the programmable logic blocks can be configured to perform complex combinational functions, or merely simple logic gates, such as AND, and XOR logic blocks.

In many FPGAs, logic blocks also include memory elements, which may be simple latches, flip-flops or more complex blocks of memory. Depending on the length of the interconnections between different logic blocks, signals may arrive at input terminals of the logic blocks at different times.

Programmable processors $1004_1$-$1004_N$ may be placed into one or more hardware boards $1012_I$ through $1012_M$. Many of such boards may be placed into a hardware unit, e.g. $1014_I$. The boards within a unit may be connected using the backplane of the unit or any other types of connections. In addition, multiple hardware units (e.g., $1014_I$ through $1014_K$) may be connected to each other by cables or any other means to form a multi-unit system. In general, the hardware emulation or prototype system 1002 may be formed using a single board, a single unit with multiple boards, or with multiple units without departing from the teachings of the present disclosure.

For a DUT that is to be emulated, the emulator receives from the host system one or more bit files including a description of the DUT. The bit files further specify partitions of the DUT created by the host system with trace and injection logic, mappings of the partitions to the FPGAs of the emulator, and design constraints. Based on the bit files, the emulator configures the FPGAs to perform the functions of the DUT. With some emulators, one or more FPGAs of an emulator already have the trace and injection logic built into the silicon of the FPGA. For this type of emulator, the FPGAs don't have to be configured by the host system to emulate trace and injection logic.

The host system 1001 receives (e.g., from a user) a description of a DUT that is to be emulated. In one embodiment, the DUT description is in a hardware description language (HDL), such as register transfer language (RTL). In another embodiment, the DUT description is in netlist level files, or a mix of netlist level files and HDL files. If part of the DUT description or the entire DUT description is in a HDL, the host system synthesizes the DUT description to create a gate level netlist based on the DUT description. A host system can use the netlist of the DUT to partition the DUT into multiple partitions, with some of these partitions including trace and injection logic. The trace and injection logic traces interface signals exchanged via the interfaces of an FPGA. Additionally, the trace and injection logic can be used to inject traced interface signals into the logic of the FPGA. The host system maps each partition to an FPGA of the emulator. With some emulators, the trace and injection logic is only included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic was incorporated, the bit files also describe the incorporation of the logic. The bit files may also include place and route information and design constraints. The host system stores the bit files and also stores for components of the DUT information describing which FPGAs are to emulate each component of the DUT (to which FPGAs each component is mapped).

Upon request, the host system transmits the bit files to the emulator. The host system instructs the emulator to emulate the DUT. During emulation of the DUT or at the end of the emulation, the host system receives emulation results from the emulator through the emulation connection. Emulation results are data and information generated by the emulator based on the emulation of the DUT. The emulation results include interface signals (states of interface signals) traced by the trace and injection logic of each FPGA. The host system can stores the emulation results, or transmit them to another processing system.

After emulation of the DUT, a user may request to debug a component of the DUT. If such a request is made the user may provide a time period of the emulation to debug. The host system identifies which FPGAs are configured to emulate the component based on the stored information. The host system retrieves stored interface signals associated with the time period and traced by the trace and injection logic of each identified FPGA. The host system instructs the emulator to re-emulate the identified FPGAs, either one by one, multiple at a time, or altogether. The host system transmits the retrieved interface signals to the emulator in order to re-emulate the component for the time period. The trace and injection logic of each identified FPGA injects its respective interface signals received from the host system into the logic of the DUT mapped to the FPGA. In case of multiple re-emulations of an FPGA, the results may be merged all together to have a full debug view.

The host system receives from the emulator signals traced by logic of the identified FPGAs during the re-emulation of the component. The host system stores the signals received from the emulator. The signals traced during the re-emulation can have a higher sampling rate than during the initial emulation. For example, in the initial run a traced signal may be comprised of a saved hardware state every X milliseconds. However, in the re-emulation the traced signal may be comprised of a saved hardware state every Y milliseconds, where Y is less than X. If the user requests to view a waveform of a signal traced during the re-emulation, the host system can retrieve the stored signal and display a plot of the signal (generates a waveform of the signal). Afterwards the user can, for example, request to re-emulate the same component but for a different time period or to re-emulate another component.

A host system typically comprises at least seven subsystems: a design synthesizer, a mapping module, a run time module, a results module, a debug module, a waveform module, and a storage module. Each of these sub-systems may be embodied as hardware, software, firmware, or a combination thereof. Together these components configure the emulator, and monitor the emulation results.

The design synthesizer converts the HDL of a DUT into gate level logic. For a DUT that is to be emulated, the design synthesizer receives a description of the DUT. If the description of the DUT is fully or partially in HDL (e.g., RTL or other level of abstraction), the design synthesizer 1010 synthesizes the HDL of the DUT to create a gate-level netlist with a description of the DUT in terms of gate level logic.

The mapping module partitions DUTs and maps partitions to emulator FPGAs. The mapping module partitions a DUT at the gate level into a number of partitions using the netlist of the DUT. For each partition, the mapping module retrieves a gate level description of the trace and injection logic and incorporates the logic into the partition. As described above, the trace and injection logic included in a partition is configured to trace signals exchanged via the interfaces of an FPGA to which the partition is mapped (trace interface signals). The trace and injection logic can be incorporated into the DUT prior to the partitioning. For example, the trace and injection logic may be incorporated by the design synthesizer prior to or after the synthesizing the HDL of the DUT. Hence, the trace and injection logic may not match the partitions, it may be a subset, a superset or even different from the partitions.

In addition to including the trace and injection logic, the mapping module may include additional tracing logic in a partition in order to trace the states of certain DUT components that are not traced by the trace and injection logic (to trace signals other than the interface signals traced by the trace and injection logic). The mapping module may include the additional tracing logic in the DUT prior to the partitioning or in partitions after the partitioning. The design synthesizer can include the additional tracing logic in an HDL description of the DUT prior to synthesizing the description.

The mapping module maps each partition of the DUT to an FPGA of the emulator. The mapping module performs the partitioning and mapping using design rules, design constraints (e.g., timing or logic constraints), and information about the emulator. For components of the DUT, the mapping module stores information in the storage module describing which FPGAs are to emulate each component.

Based on the partitioning and the mapping, the mapping module generates one or more bit files that describe the created partitions and the mapping of logic to each FPGA of the emulator. The bit files may include additional information, such as constraints of the DUT, and routing information of connections between FPGAs and connections within each FPGA. The mapping module can generate a bit file for each partition of the DUT, which can be stored in the storage module. Upon request from a user, the mapping module transmits the bit files to the emulator, which the emulator uses to configure the FPGAs to emulate the DUT.

If the emulator includes specialized ASICs that include the trace and injection logic, the mapping module may generate a specific configuration allowing to connect them to the DUT or just save the information of what traced/injected signal is and where the information is stored on the specialized ASIC.

The run time module controls emulations performed on the emulator. The run time module may cause the emulator to start or stop executing an emulation. Additionally, the run time module may provide input signals/data to the emulator. The input signals may be provided directly to the emulator through the connection or indirectly through other input signal devices. For example, the host system with the run time module may control an input signal device to provide the input signals to the emulator. The input signal device may be, for example, a test board (directly or through cables), signal generator, another emulator, or another host system.

The results module processes emulation results generated by the emulator. During emulation and/or after completing the emulation, the results module receives emulation results from the emulator generated during the emulation. The emulation results include signals traced during the emulation. Specifically, the emulation results include interface signals traced by the trace and injection logic emulated by each FPGA. The emulation results may also include signals traced by additional logic included in the DUT. Each traced signal can span multiple cycles of the emulation. A traced signal is comprised of multiple hardware states and each hardware state is associated with a time of the emulation. The results module stores the traced signals received in the storage module. For each stored signal, the results module can store information indicating which FPGA generated the traced signal.

The debug module allows users to debug DUT components. After the emulator has emulated a DUT and the results module has received the interface signals traced by the trace and injection logic during the emulation, a user may request to debug a component of the DUT by re-emulating the component for a specific time period. In a request to debug a component, the user identifies the component and indicates a time period of the emulation to debug. The user's request can also include a sampling rate that indicates how often hardware states should be saved by logic that traces signals.

The debug module identifies the one or more FPGAs of the emulator that are configured to emulate the component based on the information stored by the mapping module in the storage module. For each identified FPGA, the debug module retrieves, from the storage module, interface signals traced by the trace and injection logic of the FPGA during the time period indicated by the user (i.e., retrieve hardware states traced by the trace and injection logic that are associated with the time period).

The debug module transmits the retrieved interface signals to the emulator. The debug module instructs the debug module to run the identified FPGAs and for the trace and injection logic of each identified FPGA to inject its respective traced signals into logic of the FPGA in order to re-emulate the component for the requested time period. The debug module can also transmit the sampling rate provided by the user to the emulator so that the tracing logic traces hardware states at the proper intervals.

To debug the component, the emulator only has to run the FPGAs to which the component has been mapped. Additionally, the re-emulation of the component does not have to start from the beginning, but can start at any point desired by the user.

For an identified FPGA, the debug module can transmit instructions to the emulator to load multiple emulator FPGAs with the same configuration of the identified FPGA. The debug module additionally instructs the emulator to run the multiple FPGAs in parallel. Each FPGA from the multiple FPGAs is run with a different time window of the interface signals in order to generate a larger time window in a shorter amount of time. For example, for the identified FPGA to run a certain amount of cycles it may take an hour. However, if multiple FPGAs are loaded with the configuration of the identified FPGA and each of the FPGAs runs a subset of the cycles, it may only take a few minutes for the FPGAs to collectively run all of the cycles.

A user may identify a hierarchy or a list of DUT signals to re-emulate. To enable this, the debug module determines the FPGA needed to emulate the hierarchy or list of signals, retrieves the necessary interface signals and transmits the retrieved interface signals to the emulator for re-emulation. Hence, a user can identify any element (e.g., component or signal) of the DUT to debug/reemulate.

The waveform module generates waveforms based on traced signals. If a user requests to view a waveform of a signal traced during an emulation run, the host system retrieves the signal from the storage module. The waveform module displays a plot of the signal to the user. For one or more signals, when the signals are received from the emulator, the waveform module can automatically generate the plots of the signals.

Hardware/Software Equivalence

Some of the innovations, embodiments and/or examples described herein comprise and/or use a processor. As used herein, the term 'processor' signifies a tangible data and information processing device that physically transforms data and information, typically using a sequence transformations (also referred to as 'operations'). Data and information can be physically represented by an electrical, magnetic, optical or acoustical signal that is capable of being stored, accessed, transferred, combined, compared, or otherwise manipulated by the processor. The term "processor" can signify a singular processor and multi-core systems or multi-processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. There is no scientific evidence that any of these processors are processing, storing and retrieving data and information, in any manner or form equivalent to the bioelectric structure of the human brain.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term 'module' signifies a tangible data and information processing device, that typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Intel's Altera), Random Access Memories (RAMs) or microprocessors. A module is configured to process data and information, typically using a sequence transformations (also referred to as 'operations') applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term 'algorithm' signifies a process comprising a sequence or set of operations or instructions that a module can use to transform data and information to achieve a result. A module can comprise one or more algorithms. As used herein, the term 'thread' refers to a sequence of instructions that can comprise a subset of the instructions of an entire process or algorithm. A process or algorithm can be partitioned into multiple threads that can be executed in parallel.

As used herein, the term 'computer' includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term 'software' or 'program' signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of data and instructions that configure the processor to achieve a specific result, for example, to perform word processing operations, or to encrypt a set of data.

As used herein, the term 'programming language' signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software, or has an interface device that receives the software over a network. This process is discussed in the General Computer Explanation section.

Semantic Support

The signifier 'commercial solution' signifies, solely for the following paragraph, an engineering domain-specific (and thus non-preemptive—see Bilski) electronic structure, process for specified machines, manufacturable circuit (and their Church-Turing equivalents) or composition of matter that is useful in commerce to solve a problem of technology, that is, a use in commerce of an application of science or use in commerce of technology.

The signifier 'abstract' (when used in a patent claim for any embodiments disclosed herein for a new commercial solution that is a scientific application of one or more laws of nature {see Benson}, and that solves a problem of technology {see Diehr} used in commerce—or improves upon an existing commercial solution {see Diehr})—is precisely defined by the inventor(s) {see MPEP 2111.01} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is "difficult to understand" {see Merriam-Webster definition for 'abstract' } how the commercial solution differs from equivalent prior art solutions; or b) a new commercial solution is 'abstract' if it is obvious, that is, if the existing prior art includes at least one analogous prior art solution {see KSR}, or the existing prior art includes at least two prior art items that can be combined {see Alice} by a person having ordinary skill in the art {a "PHOSITA", see MPEP 2141-2144} to be equivalent to the new commercial solution, and is thus unpatentable under 35 U.S.C. 103, for example, because it is "difficult to understand" how the new commercial solution differs from a PHOSITA-combination/-application of the existing prior art; or c) a new commercial solution is 'abstract' if it is not disclosed with an enabling description either because there is insufficient guidance in the enabling description, or because only a generic implementation is described {see Mayo} with unspecified elements, parameters or functionality, so that a PHOSITA is unable to instantiate a useful embodiment of the new commercial solution, without, for example, requiring special programming {see Katz} or circuit design to be performed by the PHOSITA), and is thus unpatentable under 35 U.S.C. 112, for example, because it is "difficult to understand" how to use in commerce any embodiment of the new commercial solution.

CONCLUSION

As used herein, a given signal, event or value is "responsive" to a predecessor signal, event or value if the predecessor signal, event or value influenced the given signal, event or value. If there is an intervening processing element, step or time period, the given signal, event or value can still be "responsive" to the predecessor signal, event or value. If the intervening processing element or step combines more than one signal, event or value, the signal output of the processing element or step is considered "responsive" to each of the signal, event or value inputs. If the given signal, event or value is the same as the predecessor signal, event or value, this is merely a degenerate case in which the given signal, event or value is still considered to be "responsive" to the predecessor signal, event or value. "Dependency" of a given signal, event or value upon another signal, event or value is defined similarly.

As used herein, the "identification" of an item of information does not necessarily require the direct specification of that item of information. Information can be "identified" in a field by simply referring to the actual information through one or more layers of indirection, or by identifying one or more items of different information which are together sufficient to determine the actual item of information. In addition, the term "indicate" is used herein to mean the same as "identify".

As used herein, layers which are termed "above" or "below" other layers, can in various embodiments be separated from such other layers by one or more intervening layers. If no intervening layer is intended, then the terms "immediately above" or "immediately below" are used herein. The same interpretation is intended for layers being described as "superposing", "underlying", "over" or overlying another layer. Additionally, a first layer is said to "overlie" a second layer if the first layer is closer to the active surface of the device, which is also referred to herein as the "topside" of the device. Similarly, a second layer is said to "underlie" a first layer if the second layer is closer to the rear surface of the device, which is also referred to herein as the "backside" of the device. If a structure is turned upside down, that does not alter which surface is the topside and which is the backside The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof, solve any problems disclosed herein, and without limitation to the scope of the claims. When an embodiment of a claimed invention comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein are chosen to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described, but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

What is claimed is:

1. A semiconductor structure comprising:
    a column of horizontally-oriented nanosheet transistors, each of the nanosheet transistors having a respective channel segment of semiconductor crystalline nanosheet material sheathed by gate stack material; and
    a substrate supporting the column,
    wherein the channel segments of semiconductor crystalline nanosheet material have a diamond cubic crystal structure and which is oriented such that {111} planes of the nanosheet material are horizontal.

2. The structure of claim 1, wherein the column comprises a plurality of the nanosheet transistors.

3. The structure of claim 1, wherein the gate stack material comprises a gate conductor sheathing the channel segment of each of the nanosheet transistors and spaced from the channel segment of each of the nanosheet transistors by a gate dielectric material.

4. The structure of claim 3, wherein each of the nanosheet transistors further includes source and drain regions disposed on opposite ends of the of the channel segments longitudinally,
    wherein all of the source regions are connected in parallel, all of the drain regions are connected in parallel, and all of the gate conductors are connected in parallel.

5. The structure of claim 3, further comprising a second column of the horizontally-oriented nanosheet transistors,
    wherein each of the nanosheet transistors further includes source and drain regions disposed on opposite ends of the of the channel segments longitudinally,
    wherein all of the source regions are connected in parallel, all of the drain regions are connected in parallel, and all of the gate conductors are connected in parallel.

6. The structure of claim 1, wherein the semiconductor crystalline nanosheet material is silicon or a silicon alloy.

7. A method of making a semiconductor structure, comprising:
    providing a substrate; and
    forming a column of horizontally-oriented nanosheet transistors supported on the substrate, each of the nanosheet transistors having a respective channel segment of semiconductor crystalline nanosheet material sheathed by gate stack material,
    wherein the channel segments of semiconductor crystalline nanosheet material have a diamond cubic crystal structure and which is oriented such that {111} planes of the nanosheet material are horizontal.

8. The method of claim 7, wherein the column comprises a plurality of the nanosheet transistors.

9. The method of claim 7, wherein the gate stack material comprises a gate conductor sheathing the channel segment of each of the nanosheet transistors and spaced from the channel segment of each of the nanosheet transistors by a gate dielectric material.

10. The method of claim 9, wherein each of the nanosheet transistors further includes source and drain regions disposed on opposite ends of the of the channel segments longitudinally,
    wherein all of the source regions are connected in parallel, all of the drain regions are connected in parallel, and all of the gate conductors are connected in parallel.

11. The method of claim 9, further comprising forming a second column of the horizontally-oriented nanosheet transistors,
    wherein each of the nanosheet transistors further includes source and drain regions disposed on opposite ends of the of the channel segments longitudinally,
    wherein all of the source regions are connected in parallel, all of the drain regions are connected in parallel, and all of the gate conductors are connected in parallel.

12. The method of claim 7, wherein the forming of the column of the horizontally-oriented nanosheet transistors comprises:
    forming on the substrate a column of layers including at least one silicon layer each spaced from a next layer below, each of the silicon layers being oriented such that {111} planes of the silicon layers are horizontal;
    annealing the column of layers to round corners of the channel segment of each of the silicon layers in the stack; and
    sheathing the channel segment of each of the silicon layers in the stack with the gate stack material.

13. The method of claim 12, wherein the gate stack material comprises a gate conductor sheathing the channel segment of each of the nanosheet transistors and spaced from the channel segment of each of the nanosheet transistors by a gate dielectric material,
    and wherein the forming of the column of the horizontally-oriented nanosheet transistors further comprises:
        forming source and drain regions on opposite ends of the of the channel segments longitudinally;
        connecting all of the source regions in parallel;
        connecting all of the drain regions in parallel; and
        connecting all of the gate conductors in parallel.

14. The method of claim 12, wherein the forming on the substrate a column of layers including at least one silicon layer each spaced from a next layer below comprises:
    forming on the substrate a stack of silicon layers alternating with layers of a sacrificial material, including at least one silicon layer and at least one layer of the sacrificial material below each of the silicon layers and above the substrate;
    patterning the stack to form a column of the alternating silicon layers and layers of the sacrificial material; and
    removing the sacrificial material at least below a respective channel segment of each of the silicon layers in the column.

15. The method of claim 14, wherein the substrate has a top surface of silicon oriented such that {111} planes of the top surface of silicon are horizontal,
    wherein the sacrificial material has a diamond cubic crystal structure,
    and wherein the forming on the substrate a stack of silicon layers alternating with layers of a sacrificial material, comprises growing the stack of layers epitaxially on the substrate.

16. The method of claim 15, wherein the sacrificial material is SiGe.

17. An intermediate structure comprising:
    a substrate; and
    a plurality of parallel ridges supported by the substrate, wherein each of the ridges comprises a plurality of layers of silicon alternating with layers of SiGe, and wherein each of the ridges comprises at least one layer of SiGe below each silicon layer of the plurality of silicon layers and above the substrate, and wherein the silicon layers have a diamond cubic crystal structure, which is oriented such that {111} planes of the silicon layers are horizontal.

18. The intermediate structure of claim 17, wherein the SiGe layers are oriented such that {111} planes of the SiGe layers are horizontal.

19. The intermediate structure of claim 18, wherein the substrate has a top surface of {111}-oriented silicon, and wherein the SiGe layers are formed by epitaxial growth on the substrate.

* * * * *